US006987569B2

(12) United States Patent
Hill

(10) Patent No.: US 6,987,569 B2
(45) Date of Patent: Jan. 17, 2006

(54) DYNAMIC INTERFEROMETER CONTROLLING DIRECTION OF INPUT BEAM

(75) Inventor: Henry A. Hill, Tucson, AZ (US)

(73) Assignee: Zygo Corporation, Middlefield, CT (US)

( * ) Notice: Subject to any disclaimer, the term of this patent is extended or adjusted under 35 U.S.C. 154(b) by 381 days.

(21) Appl. No.: 10/226,591

(22) Filed: Aug. 23, 2002

(65) Prior Publication Data

US 2003/0043384 A1 Mar. 6, 2003

Related U.S. Application Data

(60) Provisional application No. 60/314,570, filed on Aug. 23, 2001.

(51) Int. Cl.
G01B 9/02 (2006.01)

(52) U.S. Cl. .................................. 356/500; 356/510

(58) Field of Classification Search ............... 356/4.09, 356/4.1, 486, 487, 490, 493, 500, 408, 510, 356/508
See application file for complete search history.

(56) References Cited

U.S. PATENT DOCUMENTS

| 4,413,908 | A |   | 11/1983 | Abrams et al. |
|---|---|---|---|---|
| 4,606,638 | A |   | 8/1986 | Sommargren |
| 4,662,750 | A | * | 5/1987 | Barger .................... 356/510 |
| 4,711,573 | A |   | 12/1987 | Wijntjes et al. |
| 4,714,339 | A | * | 12/1987 | Lau et al. ................ 356/508 |
| 4,790,651 | A |   | 12/1988 | Brown et al. |
| 4,802,765 | A |   | 2/1989 | Young et al. |
| 4,859,066 | A |   | 8/1989 | Sommargren |
| 4,881,816 | A |   | 11/1989 | Zanomi |
| 4,948,254 | A |   | 8/1990 | Ishida |
| 5,064,289 | A |   | 11/1991 | Bockman |
| 5,114,234 | A |   | 5/1992 | Otsuka et al. |
| 5,151,749 | A |   | 9/1992 | Tanimoto et al. |
| 5,187,543 | A |   | 2/1993 | Ebert |
| 5,249,016 | A |   | 9/1993 | Tanaka |
| 5,331,400 | A |   | 7/1994 | Wilkening et al. |
| 5,404,222 | A |   | 4/1995 | Lis |
| 5,408,318 | A |   | 4/1995 | Slater |
| 5,432,603 | A |   | 7/1995 | Sentoku et al. |

(Continued)

FOREIGN PATENT DOCUMENTS

DE 40 31 291 A1 6/1992

(Continued)

OTHER PUBLICATIONS

Badami, V.G. et al. "Investigation of Nonlinearity in High Accuracy Heterodyne Laser Interferometry." *American Society for Precision Engineering 1997 Proceedings*, 16:pp. 153-156, 1997.

(Continued)

Primary Examiner—Samuel A. Turner
(74) Attorney, Agent, or Firm—Fish & Richardson P.C.

(57) ABSTRACT

Interferometers can be configured to maintain a measurement beam substantially orthogonal to a plane measurement mirror and to minimize the lateral beam shear between the measurement and reference beam components of the output beam to a detector. These interferometers use a dynamic beam steering element to redirect the input beam in response to changes in the orientation of the measurement plane mirror. These interferometers may be further configured to measure displacement and change in orientation of the plane mirror or configured in a combination of single pass interferometers fed by the input beam for measuring displacement and change in orientation of the plane mirror.

36 Claims, 15 Drawing Sheets

U.S. PATENT DOCUMENTS

| | | | |
|---|---|---|---|
| 5,483,343 | A | 1/1996 | Iwamoto et al. |
| 5,491,550 | A | 2/1996 | Dabbs |
| 5,663,793 | A | 9/1997 | de Groot |
| 5,724,136 | A | 3/1998 | Zanoni |
| 5,757,160 | A | 5/1998 | Kreuzer |
| 5,764,361 | A | 6/1998 | Kato et al. |
| 5,781,277 | A | 7/1998 | Iwamoto |
| 5,781,297 | A | 7/1998 | Castore |
| 5,790,253 | A | 8/1998 | Kamiya |
| 5,801,832 | A | 9/1998 | Van Den Brink |
| 5,841,125 | A | 11/1998 | Livingston |
| 5,850,291 | A | 12/1998 | Tsutsui |
| 5,940,180 | A | 8/1999 | Ostby |
| 5,969,800 | A | 10/1999 | Makinouchi |
| 6,008,902 | A | 12/1999 | Rinn |
| 6,020,964 | A | 2/2000 | Loopstra et al. |
| 6,040,096 | A | 3/2000 | Kakizaki et al. |
| 6,046,792 | A | 4/2000 | Van Der Werf et al. |
| 6,134,007 | A | 10/2000 | Naraki et al. |
| 6,137,574 | A | 10/2000 | Hill |
| 6,147,748 | A | 11/2000 | Hughes |
| 6,160,619 | A | 12/2000 | Magome |
| 6,181,420 | B1 | 1/2001 | Badami et al. |
| 6,201,609 | B1 | 3/2001 | Hill et al. |
| 6,208,424 | B1 | 3/2001 | de Groot |
| 6,236,507 | B1 | 5/2001 | Hill et al. |
| 6,252,667 | B1 * | 6/2001 | Hill et al. .................. 356/508 |
| 6,252,668 | B1 | 6/2001 | Hill |
| 6,271,923 | B1 | 8/2001 | Hill |
| 6,304,318 | B1 | 10/2001 | Matsumoto |
| 6,313,918 | B1 | 11/2001 | Hill et al. |
| 6,330,065 | B1 | 12/2001 | Hill |
| 6,330,105 | B1 | 12/2001 | Rozelle et al. |
| 6,541,759 | B1 | 4/2003 | Hill |
| 6,552,804 | B2 | 4/2003 | Hill |
| 6,563,593 | B2 | 5/2003 | Hill |
| 6,687,013 | B2 | 2/2004 | Isshiki et al. |
| 6,747,744 | B2 | 6/2004 | Hill |
| 6,806,961 | B2 | 10/2004 | Hill |
| 2001/0035959 | A1 | 11/2001 | Hill |
| 2002/0048026 | A1 | 4/2002 | Isshiki et al. |
| 2002/0089671 | A1 | 7/2002 | Hill |
| 2003/0053074 | A1 | 3/2003 | Hill |
| 2003/0090675 | A1 | 5/2003 | Fujiwara |
| 2003/0117631 | A1 | 6/2003 | Hill et al. |

FOREIGN PATENT DOCUMENTS

| | | |
|---|---|---|
| EP | 0 514 579 A1 | 11/1992 |
| EP | 0 689 030 A2 | 12/1995 |
| JP | 7-351078 | 12/1995 |
| JP | 8-117083 | 4/1996 |
| JP | 10 260009 | 9/1998 |
| WO | WO 00/17605 | 3/2000 |
| WO | WO 00/66969 | 11/2000 |

OTHER PUBLICATIONS

Bennett, S.J. "A Double-Passed Michelson Interferometer." *Optics Communications*, 4:6, pp. 428-430, 1972.

Bobroff, Norman. "Recent advances in displacement measuring interferometry." *Meas. Sci. Technol*, 4: pp. 907-926, 1993.

Hines, Brad et al. "Sub-Nanometer Laser Metrology-Some Techniques and Models." *European Southern Observatory, ESO Conference*, pp. 1195-1204, 1991.

Oka, K. et al., "Polarization heterodyne interferometry using another local oscillator beam." *Optics Communications*, 92:pp 1-5, 1992.

Wu, Chien-Ming. Analytical modeling of the periodic nonlinearity in heterodyne interferometry. *Applied Optics*, 37:28 pp. 6696-6700, 1998.

Bennett, S.J. . "A Double-Passed Michelson Interferometer." Optics Communications, 4:6, pp. 428-430, 1972.

Wu et al. "Analytical modeling of the periodic nonlinearity in heterodyne interferometry." Applied Optics, 37:28, pp. 6696-6700, 1998.

Hines et al. Sub-Nonometer Laser Metrology—Some Techniques and Models. ESO Conference on High-Resolution Imaging by Interferometry II, pp. 1195-1204, 1991.

Bobroff, Norman. "Recent advances in displacement measuring interferometry." Meas. Sci. Technol. 4, pp. 907-926, 1993.

Oka et al. "Polarization heterodyne interferometry using another local oscillator beam." Optics Communications, 92, pp. 1-5, 1992.

Mauer, Paul. "Phase Compensation of Total Interanal Reflection." J. Opt. Soc. Am., 56:9, pp. 1219-1221, 1966/.

Player, M.A. "Polarization properties of a cube-corner reflector." J. Mod. Opt., 35:11, pp. 1813-1820, 1988.

Badami et al. "Investigation of NonLinearity in High Accuracy Heterodyne Laser Interferometry." American Society for Precision Engineering, 1997, Proceedings, 16, pp. 153-156, 1997.

Bobroff, Norman. "Residual errors in laser interferometry from air turbulence and nonlinearity." Applied Optics, 26: 13, pp. 2676-2686, 1987.

Mitsuru Tanaka, et al., "Linear Interpolation of Periodic Error in a Heterodyne Laser Interferometer at Subnanometer Levels", IEEE Transactions on Instrumentation and Measurement, 38:2, pp. 553-554, Apr. 1989.

Wu et al., "Nonlinearity in measurements of length by optical interferometry", Measurement Science and Technology, 7:1, pp. 62-68, Jan. 1996.

* cited by examiner

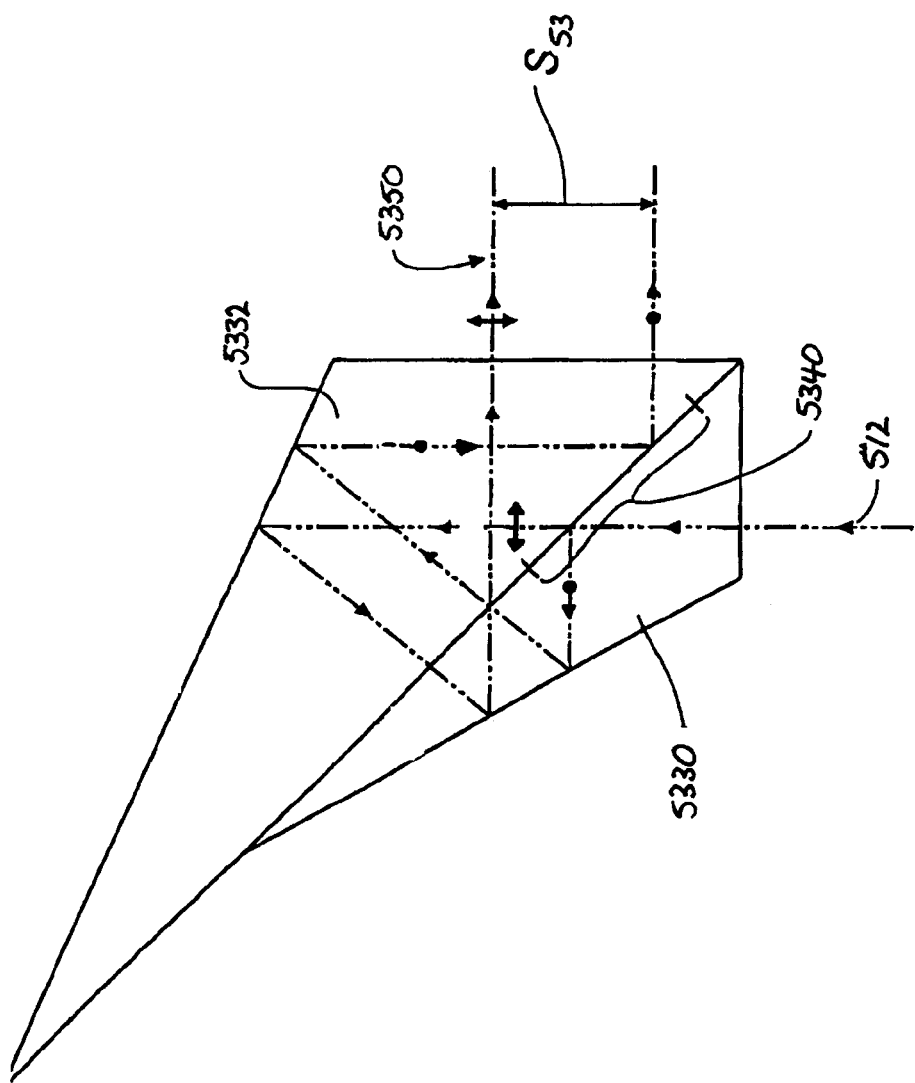

DYNAMIC INTERFEROMETER CONTROLLING DIRECTION OF INPUT BEAM

CROSS-REFERENCE TO RELATED APPLICATIONS

This claims priority to Provisional Patent Application 60/314,570, filed Aug. 23, 2001, entitled "DYNAMIC INTERFEROMETER CONTROLLING DIRECTION OF INPUT BEAM," to Henry A. Hill, the contents of which are incorporated herein by reference in their entirety.

BACKGROUND

This invention relates to interferometers, e.g., displacement measuring and dispersion interferometers that measure angular and linear displacements of a measurement object such as a mask stage or a wafer stage in a lithography scanner or stepper system.

Displacement measuring interferometers monitor changes in the position of a measurement object relative to a reference object based on an optical interference signal. The interferometer generates the optical interference signal by overlapping and interfering a measurement beam reflected from the measurement object with a reference beam reflected from the reference object.

In many applications, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarizing beam splitter to direct the measurement and reference beams to the measurement and reference objects, respectively, and combine the reflected measurement and reference beams to form overlapping exit measurement and reference beams. The overlapping exit beams form an output beam that subsequently passes through a polarizer.

The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams. A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2vnp/\lambda$, where $v$ is the relative speed of the measurement and reference objects, $\lambda$ is the wavelength of the measurement and reference beams, $n$ is the refractive index of the medium through which the light beams travel, e.g., air or vacuum, and $p$ is the number of passes to the reference and measurement objects. Changes in the relative position of the measurement object correspond to changes in the phase of the measured interference signal, with a $2\pi$ phase change substantially equal to a distance change $L$ of $\lambda/(np)$, where $L$ is a round-trip distance change, e.g., the change in distance to and from a stage that includes the measurement object.

Unfortunately, this equality is not always exact. In addition, the amplitude of the measured interference signal may be variable. A variable amplitude may subsequently reduce the accuracy of measured phase changes. Many interferometers include non-linearities such as what are known as "cyclic errors." The cyclic errors can be expressed as contributions to the phase and/or the intensity of the measured interference signal and have a sinusoidal dependence on the change in optical path length pnL. In particular, the first harmonic cyclic error in phase has a sinusoidal dependence on $(2\pi pnL)/\lambda$ and the second harmonic cyclic error in phase has a sinusoidal dependence on $2(2\pi pnL)/\lambda$. Higher harmonic cyclic errors can also be present.

There are also "non-cyclic non-linearities" such as those caused by a change in lateral displacement between the reference and measurement beam components of an output beam of an interferometer when the wavefronts of the reference and measurement beam components have wavefront errors. The lateral displacement between the beam components is also referred to as "relative beam shear" or "differential beam shear." Relative beam shear causes non-cyclic, non-linearities for the following reasons.

Inhomogeneities in the interferometer optics may cause wavefront errors in the reference and measurement beams. When the reference and measurement beams propagate collinearly with one another through such inhomogeneities, the resulting wavefront errors are identical and their contributions to the interferometric signal cancel each other out. More typically, however, the reference and measurement beam components of the output beam are laterally displaced from one another, i.e., they have a relative beam shear. Such beam shear causes the wavefront errors to contribute an error to the interferometric signal derived from the output beam.

Moreover, in many interferometry systems relative beam shear changes as the position or angular orientation of the measurement object changes. For example, a change in relative beam shear can be introduced by a change in the angular orientation of a plane mirror measurement object. Accordingly, a change in the angular orientation of the measurement object produces a corresponding error in the interferometric signal.

The effect of the relative beam shear and wavefront errors will depend upon procedures used to mix components of the output beam with respect to component polarization states and to detect the mixed output beam to generate an electrical interference signal. The mixed output beam may for example be detected by a detector without any focusing of the mixed beam onto the detector, by detecting the mixed output beam as a beam focused onto a detector, or by launching the mixed output beam into a single mode or multi-mode optical fiber and detecting a portion of the mixed output beam that is transmitted by the optical fiber. The effect of the relative beam shear and wavefront errors will also depend on properties of a beam stop should a beam stop be used in the procedure to detect the mixed output beam. Generally, the errors in the interferometric signal are compounded when an optical fiber is used to transmit the mixed output beam to the detector.

Amplitude variability of the measured interference signal can be the net result of a number of mechanisms. One mechanism is a relative beam shear of the reference and measurement components of the output beam that is for example a consequence of a change in orientation of the measurement object.

Note that in addition to "relative beam shear," one can also refer to "average beam shear" or "common mode shear," which refer to a change in the average lateral position of a beam as a whole. For example, in some interferometric arrangements the beam as a whole (including both reference and measurement components) may undergo a change in its lateral position ("common mode beam shear") in response to a change in the orientation of a measurement object or in response to a change in orientation of a fold mirror.

In dispersion measuring applications, optical path length measurements are made at multiple wavelengths, e.g., 532 nm and 1064 nm, and are used to measure dispersion of a gas in the measurement path of the distance measuring interferometer. The dispersion measurement can be used in converting the optical path length measured by a distance measuring interferometer into a physical length. Such a conversion can be important since changes in the measured optical path length can be caused by gas turbulence and/or by a change in the average density of the gas in the measurement arm even though the physical distance to the measurement object is unchanged.

SUMMARY

An interferometer can be configured to maintain a measurement beam substantially orthogonal to a plane measurement mirror and to minimize the lateral beam shear between the measurement and reference beam components of the output beam to a detector. This interferometer uses a dynamic beam steering element to redirect the input beam in response to changes in the orientation of the measurement plane mirror. The interferometer may be configured as a single-pass interferometer. The interferometer may be further configured to measure displacement and change in orientation of the plane mirror or configured in a combination of single pass interferometers fed by the input beam for measuring displacement and change in orientation of the plane mirror.

The interferometer may be used in conjunction with a differential angle displacement interferometer and/or an angle displacement interferometer. A differential angle displacement interferometer monitors a difference between the propagation direction of the measurement beam and a reference beam exiting the interferometer. An angle displacement interferometer monitors the propagation direction of either the exiting measurement or reference beams, or the average propagation direction of these beams. Changes in the orientation of the measurement plane mirror can change the phase of an interference signal at the differential angle displacement interferometer and/or angle displacement interferometer. Accordingly, the dynamic element may be adjusted in response to these phase changes.

Furthermore, the interferometer may be incorporated as part of a positioning system in a microlithography or beam writing tool.

In one aspect, the invention features an interferometry system, including an interferometer, which during operation receives an input beam, separates the input beam into a measurement beam and another beam, directs the measurement beam to contact a measurement object, and overlaps the measurement beam after it reflects from the measurement object with the other beam to form an output beam. The interferometry system also includes a beam steering assembly having a beam steering element positioned to direct the input beam into the interferometer and to not contact the output beam, and an electronic positioning system to selectively orient the beam steering element relative to the interferometer. The interferometry system further includes a control circuit coupled to the positioning system which during operation causes the positioning system to reorient the beam steering element based on information derived from the output beam.

Implementations of the interferometry system can include one or more of the following features.

The control circuit can include a signal processor, which during operation calculates a change in angular orientation of the measurement object based on the information derived from the output beam. During operation, the control circuit can cause the positioning system to reorient the beam steering element in response to a change in the angular orientation of the measurement object. Alternatively, or additionally, the control circuit can cause the positioning system to reorient the beam steering element based on a change in direction or position of the measurement beam.

The interferometer can direct the measurement beam to contact the measurement object once or multiple times.

In some embodiments, the measurement object is a plane mirror. In these embodiments, the beam steering assembly can cause the measurement beam to be orthogonal to the plane mirror for a range of orientations of the plane mirror.

The beam steering assembly can change a propagation direction of the input beam in response to changes in the output beam in order to minimize a difference in propagation directions between the measurement beam and the other beam in the output beam.

The control circuit can include a differential angle displacement interferometer, which during operation generates an interference signal related to a difference in propagation directions between the measurement beam and the other beam in the output beam. This interference signal can be related to a difference in propagation directions in a first plane between the measurement beam and the other beam in the output beam. In some cases, the interference signal can be related to the orientation of the measurement object. The interferometry system can also include a second differential angle displacement interferometer, which during operation generates an interference signal related to a difference in propagation directions between the measurement beam and the at least one other beam in the output beam in a second plane perpendicular to the first plane.

In embodiments including a differential angle displacement interferometer, the interferometry system can include a beam splitter, which during operation derives a secondary output beam from the output beam and directs the secondary output beam towards the differential angle displacement interferometer. During operation, the differential angle displacement interferometer splits the secondary output beam into first and second components, directs the first and second components along first and second paths, and overlaps the first and second components at a detector. The overlapping first and second components can cause the detector to generate an interference signal related to a propagation direction of the output beam. The differential angle displacement interferometer can include an etalon, and transmission of the secondary output beam through the etalon can be related to a propagation direction of the output beam.

As an alternative, or in addition to the differential angle displacement interferometer, the control circuit further can include an angle displacement interferometer, which during operation generates an interference signal related to a propagation direction of the output beam.

The interferometry system can include additional elements. For example, the system can include a light source positioned relative to the beam steering assembly so that during operation the light source directs the input beam toward the beam steering assembly. As another example, the interferometry system can include a detector positioned to receive the output beam from the interferometer.

The interferometry system, including any of the above-mentioned features, can be incorporated into other systems. For example, the interferometry system can be included in a lithography system for use in fabricating integrated circuits on a wafer. Such an interferometry system can include a stage for supporting the wafer, an illumination system for imaging spatially patterned radiation onto the wafer, and a positioning system for adjusting the position of the stage relative to the imaged radiation in addition to the interferometry system. The interferometry system is used for monitoring the position of the wafer relative to the imaged radiation.

Another example of a lithography system for use in fabricating integrated circuits on a wafer includes a stage for supporting the wafer, and an illumination system including a radiation source, a mask, a positioning system, a lens assembly, and the interferometry system. During operation, the source directs radiation through the mask to produce spatially patterned radiation, the positioning system adjusts the position of the mask relative to the radiation from the source, the lens assembly images the spatially patterned radiation onto the wafer, and the interferometry system monitors the position of the mask relative to the radiation from the source.

A further example of a lithography system for fabricating integrated circuits includes first and second components, the first and second components being movable relative to one another; and the interferometry system. The interferometry system is secured to the second component, and the measurement object is rigidly secured to the first component. During operation, the interferometry system measures the position of the first component relative to the second component.

The interferometry system can also be included in a beam writing system for use in fabricating a lithography mask. Such a system can include a source providing a write beam to pattern a substrate, a stage supporting the substrate, a beam directing assembly for delivering the write beam to the substrate, a positioning system for positioning the stage and beam directing assembly relative one another, and the interferometry system for monitoring the position of the stage relative to the beam directing assembly.

In general, in another aspect, the invention features an interferometry method, including directing an input beam to contact a beam steering element prior to entering an interferometer, splitting the directed input beam into a measurement beam and at least one other beam, directing the measurement beam to reflect from the measurement object at least once, overlapping the reflected measurement beam and the at least one other beam to form an output beam which does not contact the beam steering element; and electronically reorienting the beam steering element based on information derived from the output beam.

The aforementioned interferometry system, including any of the above described features, can be adapted to implement the interferometry method. Similarly, the interferometry method can further include any of the features of the interferometry system. The method can be implemented as part of the operation of a lithography and/or beam writing systems. For example, a lithography method can include positioning a first component of a lithography system relative to a second component of a lithography system to expose a wafer to spatially patterned radiation, and measuring the position of the first component relative to the second component using the interferometry method wherein the first component includes the measurement object. As another example, a beam writing method for use in fabricating a lithography mask can include directing a write beam to a substrate to pattern the substrate, positioning the substrate relative to the write beam, and measuring the position of the substrate relative to the write beam using the interferometry method.

Embodiments of the interferometry systems and methods described above include many advantages.

For example, the system can maintain the exit reference and measurement beams substantially parallel to one another over a range of orientations of the measurement object, and can do so with only a single pass of the measurement beam to the measurement object. The single-pass system reduces the bandwidth of electronics needed to process electrical interference signals having Doppler shifts, relative to those of a double-pass interferometer. Furthermore, the single-pass system reduces the likelihood of depolarization, scattering, and undesired spurious reflections from transmissive optics within the interferometer, relative to those for a double-pass interferometer. Such effects can introduce errors, e.g., cyclic errors, in the measured phase of the electrical interference signal.

In addition, the system can minimize the transverse displacement of the exit reference and measurement beams or the transverse displacement of components of the reference and measurement beams within the interferometer caused by changes in the angular orientation or position of the measurement object. As a result, the average amplitude of the electrical interference signal produced from the mixed exit reference and measurement beams can be substantially independent of changes in the angular orientation and position of the measurement object. In addition, the system reduces changes of the paths of the measurement and reference beams through transmissive optics of the interferometer, e.g., polarizing beam splitters and quarter wave plates, caused by changes in the angular orientation or position of the measurement object. Such transmissive optics can have imperfections in their surface figures and local variations in refractive index. Thus, changes in the paths of the beams through such optics can change the optical path length measured by the interferometer even though the distance between the measurement object and the interferometer has not changed. Such negative effects can be compounded if the transmissive optic has dispersive properties, such as those produced by a wedge.

Unless otherwise defined, all technical and scientific terms used herein have the same meaning as commonly understood by one of ordinary skill in the art to which this invention belongs. Although methods and systems similar or equivalent to those described herein can be used in the practice or testing of the present invention, suitable methods and systems are described below. All publications, patent applications, patents, and other references mentioned herein are incorporated by reference in their entirety. In case of conflict, the present specification, including definitions, will control. In addition, the systems, methods, and examples are illustrative only and not intended to be limiting.

Other features and advantages of the invention will be apparent from the following detailed description, and from the claims.

DESCRIPTION OF DRAWINGS

The invention will now be further described merely by way of example with reference to the accompanying drawings in which:

FIG. 5A–FIG. 5E are schematic diagrams of other angle displacement interferometers.

Like reference symbols in the various drawings indicate like elements.

DESCRIPTION OF PREFFERED EMBODIMENTS

Figure 1A:
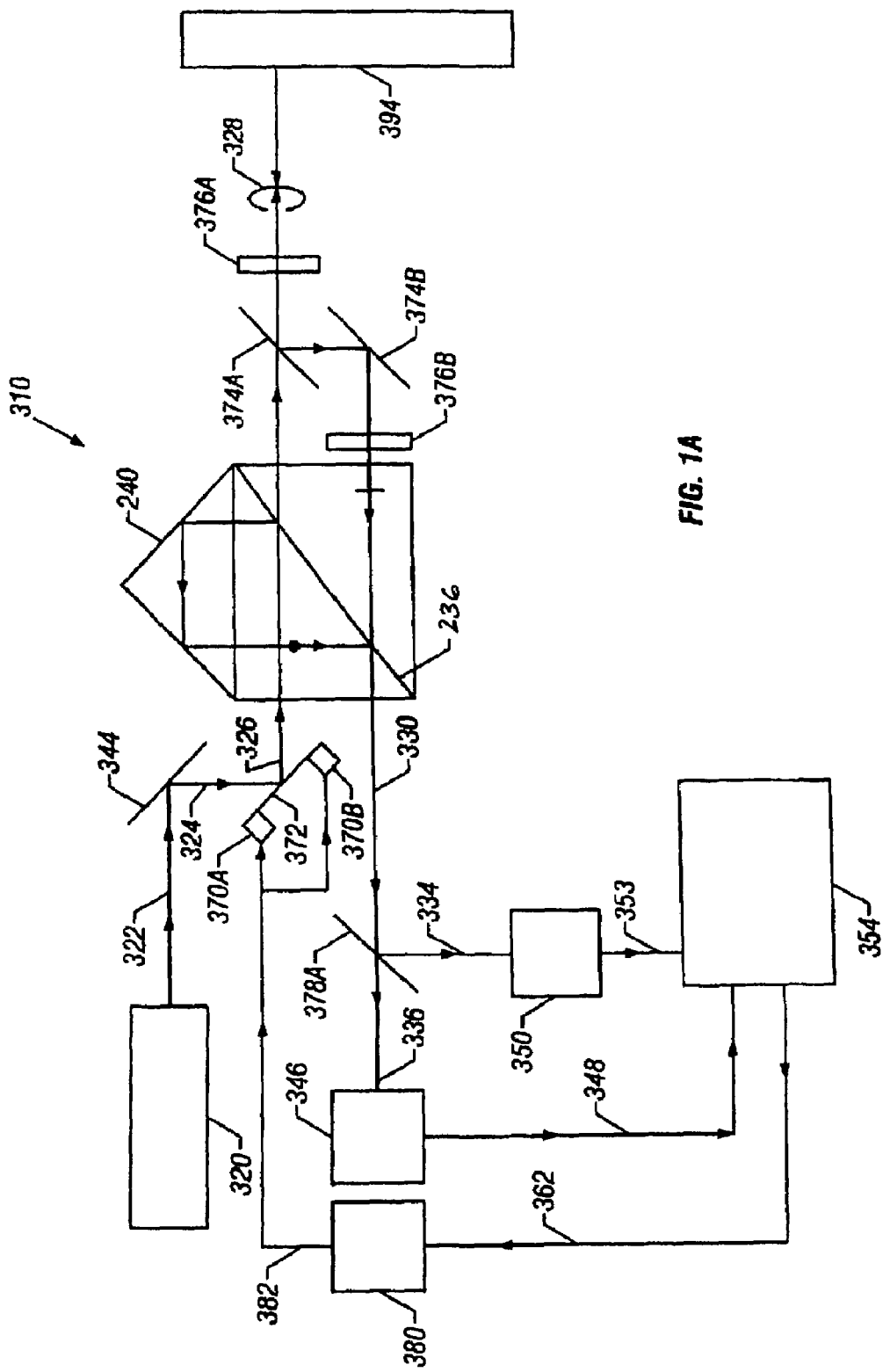
FIG. 1A–FIG. 1C are schematic diagrams of first and second embodiments of the present invention.

FIG. 1A depicts in schematic form an apparatus and method in accordance with the first embodiment of the present invention for measuring and monitoring changes in displacement of a plane mirror measurement object wherein the propagation direction of a measurement beam of an interferometer system is substantially orthogonal to the plane mirror and there is substantially no beam shear at the interferometer system. The orientation of the measurement object may be changing. The interferometer system of the first embodiment comprises a polarizing, heterodyne, single pass interferometer with a dynamic beam-steering element generally depicted in FIG. 1A at 310 and differential angle displacement interferometer 350. Although the first embodiment comprises a heterodyne system, the instant invention is readily adapted for use in a homodyne system in which the reference and measurement beams have the same frequencies before introduction of any Doppler shifts.

The first embodiment of the present invention measures a displacement of measurement object mirror 394 wherein the propagation direction of measurement beam 328 is orthogonal to the reflecting surface of mirror 394 independent of changes in orientation of mirror 394 in the plane of FIG. 1A. In addition, there are substantially no shears of reference and measurement beams in single pass interferometer 310 and in differential angle displacement interferometer 350. In addition, the shear of measurement beam 328 at mirror 394 is one quarter of the shear of the second pass measurement beam of a double pass plane mirror interferometer at the plane mirror measuring object for equivalent conditions with respect to a change in orientation of measuring object and to distance between the interferometers and the measuring object.

Referring to FIG. 1A, source 320 such as a laser can be any of a variety of frequency modulation apparatus and/or lasers. For example, the laser can be a gas laser, e.g., a HeNe laser, stabilized in any of a variety of conventional techniques known to those skilled in the art, see for example, T. Baer et al., "Frequency Stabilization of a 0.633 $\mu$m He—Ne-longitudinal Zeeman Laser," *Applied Optics*, 19, 3173–3177 (1980); Burgwald et al., U.S. Pat. No. 3,889,207, issued Jun. 10, 1975; and Sandstrom et al., U.S. Pat. No. 3,662,279, issued May 9, 1972. Alternatively, the laser can be a diode laser frequency stabilized in one of a variety of conventional techniques known to those skilled in the art, see for example, T. Okoshi and K. Kikuchi, "Frequency Stabilization of Semiconductor Lasers for Heterodyne-type Optical Communication Systems," *Electronic Letters*, 16, 179–181 (1980) and S. Yamaqguchi and M. Suzuki, "Simultaneous Stabilization of the Frequency and Power of an AlGaAs Semiconductor Laser by Use of the Optogalvanic Effect of Krypton," *IEEE J. Quantum Electronics*, QE-19, 1514–1519 (1983).

Two optical frequencies may be produced by one of the following techniques: (1) use of a Zeeman split laser, see for example, Bagley et al., U.S. Pat. No. 3,458,259, issued Jul. 29, 1969; G. Bouwhuis, "Interferometrie Mit Gaslasers," Ned. T. Natuurk, 34, 225–232 (Aug. 1968); Bagley et al., U.S. Pat. No. 3,656,853, issued Apr. 18, 1972; and H. Matsumoto, "Recent interferometric measurements using stabilized lasers," *Precision Engineering*, 6(2), 87–94 (1984); (2) use of a pair of acousto-optical Bragg cells, see for example, Y. Ohtsuka and K. Itoh, "Two-frequency Laser Interferometer for Small Displacement Measurements in a Low Frequency Range," *Applied Optics*, 18(2), 219–224 (1979); N. Massie et al., "Measuring Laser Flow Fields With a 64-Channel Heterodyne Interferometer," *Applied Optics*, 22(14), 2141–2151 (1983); Y. Ohtsuka and M. Tsubokawa, "Dynamic Two-frequency Interferometry for Small Displacement Measurements," *Optics and Laser Technology*, 16, 25–29 (1984); H. Matsumoto, ibid.; P. Dirksen, et al., U.S. Pat. No. 5,485,272, issued Jan. 16, 1996; N. A. Riza and M. M. K. Howlader, "Acousto-optic system for the generation and control of tunable low-frequency signals," *Opt. Eng.*, 35(4), 920–925 (1996); (3) use of a single acousto-optic Bragg cell, see for example, G. E. Sommargren, commonly owned U.S. Pat. No. 4,684,828, issued Aug. 4, 1987; G. E. Sommargren, commonly owned U.S. Pat. No. 4,687,958, issued Aug. 18, 1987; P. Dirksen, el al., ibid.; (4) use of two longitudinal modes of a randomly polarized HeNe laser, see for example, J. B. Ferguson and R. H. Morris, "Single Mode Collapse in 6328 Å HeNe Lasers," *Applied Optics*, 17(18), 2924–2929 (1978); (5) use of birefringent elements or the like internal to the laser, see for example, V. Evtuhov and A. E. Siegman, "A "Twisted-Mode" Technique for Obtaining Axially Uniform Energy Density in a Laser Cavity," *Applied Optics*, 4(1), 142–143 (1965); or the use of the systems described in commonly owned U.S. Pat. No. 6,236,507 B1 entitled "Apparatus to Transform Two Non-Parallel Propagating Optical Beam Components into Two Orthogonally Polarized Beam Components" by Henry A. Hill and Peter de Groot and commonly owned U.S. Pat. No. 6,157,660 entitled "Apparatus for Generating Linearly-Orthogonally Polarized Light Beams" by Henry A. Hill, the contents of both commonly owned patents which are incorporated herewithin in their entirety by way of reference.

The specific device used for the source 320 of beam 322 will determine the diameter and divergence of beam 322. For some sources, e.g., a diode laser, it will likely be necessary to use conventional beam shaping optics, e.g., a conventional microscope objective, to provide beam 322 with a suitable diameter and divergence for elements that follow. When the source is a HeNe laser, for example, beam-shaping optics may not be required.

As illustrated in FIG. 1A, beam 322 is reflected by mirror 344 as beam 324. Input beam 324 is incident on interferometer 310 comprising a dynamic beam steering element 372 and is reflected by dynamic beam steering element 372 as beam 326. The measurement beam component of beam 326 is transmitted sequentially by polarizing interface 236, polarizing beam-splitter 374A, and quarter-wave phase retardation plate 376A as a component of measurement beam 328. The return component of measurement beam 328 exits interferometer 310 as a measurement beam component of output beam 330 after being transmitted by elements comprising quarter-wave phase retardation plate 376A, half-wave phase retardation plate 376B, and polarizing interface 236 and after being reflected by polarizing beam-splitter 374A and mirror 374B. Quarter-wave phase retardation plate 376A is oriented to rotate the plane of polarization of a measurement beam by 90 degrees following a double pass through phase retardation plate 376A. Half-wave phase retardation plate 376B is oriented to rotate the plane of polarization of a measurement beam by 90 degrees following a single pass through phase retardation plate 376B.

The reference beam component of beam 326 is reflected twice by polarizing interface 236 and once by retroreflector 240 as a reference beam component of output beam 330.

A first portion of output beam 330 is reflected by beam-splitter 378A as a first output beam 334. A second portion of output beam 330 is transmitted by beam-splitter 378A as a second output beam 336. First output beam 334 is incident on differential angle displacement interferometer 350 and second output beam 336 is incident on detector 346.

Analyzer 378A comprises a polarizing beam-splitter oriented so as to mix the reference beam and measurement beam components of beam 330 in reflected and transmitted beams 334 and 336. The direction of propagation of beam 334 is actually at an angle of 45 degrees to the plane of FIG. 1A. However, for simplifying the diagrammatic representation of the first embodiment in FIG. 1A without compromising the description of the important features of the present invention, the orientation of analyzer 378A is shown in FIG. 1A as reflecting beam 334 in the plane of FIG. 1A.

Interferometer 310 introduces phase shift $\phi_1$ between the measurement and reference beam components of beam 330 so that beam 330 is a phase-shifted beam. The same phase shift $\phi_1$ is introduced between the measurement and reference beam components of beams 334 and 336. The magnitude of phase shift $\phi_1$ is related to difference in round-trip physical length $2L_1$ of the measurement path and reference paths according to the formula $$\phi_1 = 2k_1 L_1 n_1 \tag{1}$$

where $n_1$ is the average of the refractive index of a gas in the measurement path.

Output beam 334 is incident on differential angle displacement interferometer 350. Examples of differential angle displacement interferometers are described in detail below. Differential angle displacement interferometer 350 is a differential angle displacement interferometer used to introduce a relative phase shift $\phi_2$ between the measurement and reference beam components of output beam 334. Relative phase shift $\phi_2$ is related to the difference in the directions of propagation $\alpha_1$ of the measurement and reference beam components of second output beam 334 in a plane defined by the orientation of differential angle displacement interferometer 350. Relative phase shift $\phi_2$ is subsequently measured and used as an error signal in a servo control system that controls the orientation of dynamic beam steering element 372 such that angle $\alpha_1$ is maintained at a value substantially equal to zero. The servo control system includes a control circuit having a signal processor that calculates the change in the angular orientation of the measurement object from the relative phase shift measured by the differential angle displacement interferometer. Although the error signal in the described embodiment is derived from a differential angle displacement interferometer, other devices can also be used to generate the error signal. For example, a quadrature detector or a CCD camera can be used to generate the error signal from the output beam.

Output beam 336 is a mixed beam and is detected by detector 346 to generate electrical interference signal or heterodyne signal 348. Detector 346 is preferably a quantum photon detector and heterodyne signal 348 contains as a heterodyne phase $\phi_1$. Heterodyne signal 348 is transmitted to analyzer 354. Analyzer 354 comprises a phase meter that obtains heterodyne phase $\phi_1$ using a phase meter and a reference phase from source 320. Analyzer 354 further comprises a processor that computes the change in displacement of mirror 394 using Equation (1).

Analyzer 354 comprises a processor that extracts phase ($\phi_1 + \phi_2$) from heterodyne signal 353 by a phase meter using a reference phase from source 320. Analyzer 354 computes $\phi_2$ from the difference of measured phases ($\phi_1 + \phi_2$) and $\phi_1$. Analyzer 354 next computes the difference in angle $\alpha_1$ from the computed phase $\phi_2$. Measured angle difference $\alpha_1$ is transmitted to servo controller 380 as signal 362 to generate servo control signal 382. Servo control signal 382 is transmitted to transducers 370A and 370B that control the orientation of dynamic beam steering element 372 in the plane of FIG. 1A. The effect of the servo control of dynamic beam steering element 372 is to servo the orientation of element 372 to maintain $$\alpha_1 = 0 \tag{2}$$

as the orientation of object mirror 394 changes and the direction of measurement beam 328 changes accordingly. When the condition $\alpha_1 = 0$ is met, the direction of propagation of beam 328 is normal to the reflecting surface of object mirror 394.

The second embodiment of the present invention is shown diagrammatically by FIG. 1A of the first embodiment except for angle detector 350 that is replaced by an angle detector that detects changes in direction of propagation of a beam in two orthogonal directions. The second embodiment measures a linear displacement of plane mirror 394 wherein the propagation direction of measurement beam 328 is orthogonal to the surface of mirror 394 independent of changes in orientation of mirror 394 in the plane of FIG. 1A and in a plane orthogonal to the plane of FIG. 1A. There are substantially no shears of reference and measurement beams in single pass interferometer 310 and differential angle displacement interferometer system replacement for differential angle displacement interferometer 350. In addition, the shear of measurement beam 328 at mirror 394 is one quarter of the shear of the second pass measurement beam of a double pass plane mirror interferometer at the plane mirror measuring object for equivalent conditions with respect to a change in orientation of measuring object and to distance between the interferometers and the measuring object.

Figure 1B:
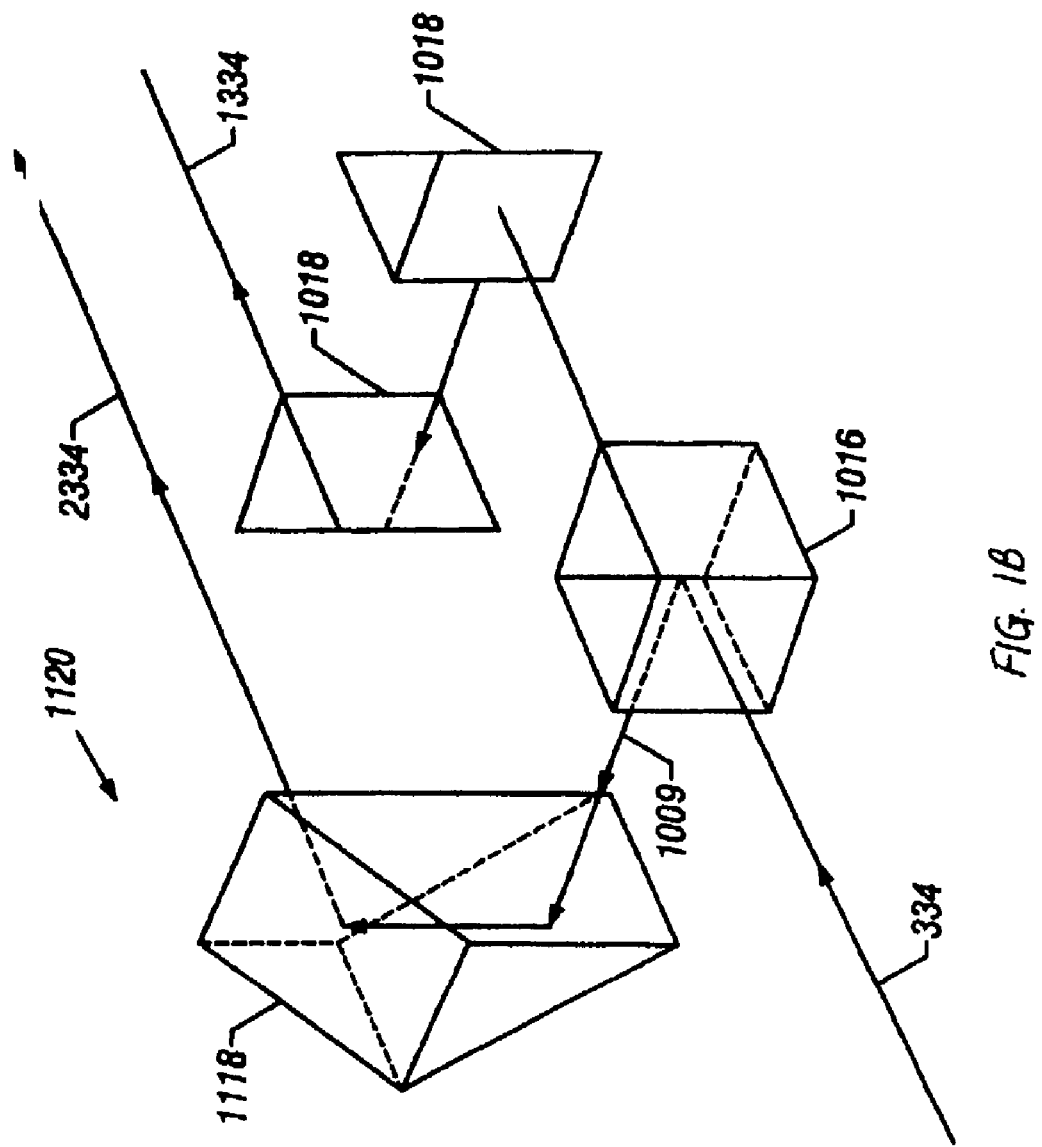

Output beam 334 is incident on beam-splitter assembly 1120 and transmitted as beams 1334 and 2334 (see FIG. 1B). Beam-splitter assembly 1120 comprises a non-polarizing beam-splitter 1016, prism 1118, and rhomboid 1018. Rhomboid 1018 that is shown as separated into two right angle prisms in FIG. 1B translates the component of beam 334 transmitted by non-polarizing beam-splitter 1016 as beam 1334. Rhomboid 1018 does not rotate the plane of polarization of an input beam so that the polarization of beam 1334 is the same as the polarization of the beam transmitted by non-polarizing beam-splitter 1016. In addition, a change in direction of propagation of beam 1334 resulting from a change in direction of propagation of the corresponding components of beam 334 are equal.

Prism 1118 comprises two right angle prisms configured to change the direction of propagation of an incident beam by 90 degrees (see FIG. 1B). Accordingly, the combination of non-polarizing beam splitter 1016 and prism 1118 transforms a change in direction of propagation of an input beam by 90 degrees and rotates the plane of polarization of the input beam by 90 degrees. As a consequence, the polarization of an input beam that is orthogonal to a plane defined by beams 334 and 1009 is rotated by 90 degrees such that the polarization of output beam 2334 in parallel to the plane. In addition, an angular displacement of the components of input beam 334 orthogonal to the plane results in an angular displacement of beam 2334 parallel to the plane.

Figure 1C:
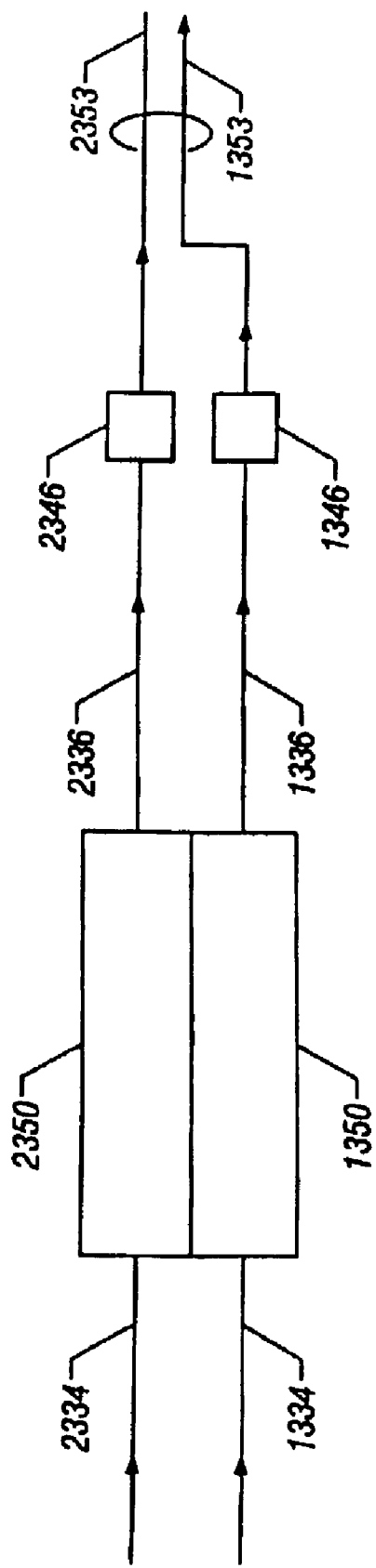

Beams 1334 and 2334 are incident on differential angle displacement interferometers 1350 and 2350 as illustrated in FIG. 1C and exit differential angle displacement interferometers 1350 and 2350 as output beams 1336 and 2336, respectively. Output beams 1336 and 2336 are detected by detectors 1346 and 2346, respectively, and generate heterodyne signals 1353 and 2353, respectively.

Interferometer 1350 introduces a phase $\phi_2$ between the measurement and reference beam components of beam 1336. Similarly, interferometer 2350 introduces a phase $\phi_{20}$ between the measurement and reference beam components of beam 2336. Relative phase shift $\phi_{20}$ is related to the difference in the directions of propagation $\alpha_{10}$ of the measurement and reference beam components of second output beam 334 in a plane orthogonal to the plane represented by $\alpha_1$.

Thus, heterodyne signals 1353 and 2353 contain information about angular displacements of beam 334 parallel to the plane and orthogonal to the plane of FIG. 1C. The plane of FIG. 1C is conjugate to the plane of FIG. 1A.

The phases of heterodyne signals 1353 and 2353, $(\phi_1+\phi_2)$ and $(\phi_1+\phi_{20})$ respectively, are measured by phase meters in analyzer 354 using a reference phase from source 320. Analyzer 354 computes $\phi_2$ and $\phi_{20}$ as the differences $[(\phi_1+\phi_2)-\phi_1]$ and $[(\phi_1+\phi_{20})-\phi_1]$, respectively. Analyzer next computes the difference in angles $\alpha_1$ and $\alpha_{10}$ from the computed $\phi_2$ and $\phi_{20}$, respectively. Measured angle differences $\alpha_1$ and $\alpha_{10}$ are transmitted to servo controller 380 as signal 362 to generate servo control signal 382. Servo control signal 382 is transmitted to transducers 370A, 370B and a third transducer not shown in FIG. 1A that control the orientation of dynamic beam steering element 372 in the plane and orthogonal to the plane of FIG. 1A. The effect of the servo control of dynamic beam steering element 372 is to servo the orientation of element 372 to maintain $$\alpha_1=0, \alpha_{10}=0 \quad (3)$$

as the orientation of object mirror 394 changes and the propagation direction of measurement beam 328 changes accordingly. When the conditions $\alpha_1=0$ and $\alpha_{10}=0$ are met, the direction of propagation of beam 328 is normal to the reflecting surface of object mirror 394 in two orthogonal planes.

The remaining description of the second embodiment is the same as corresponding portions of the description given for the first embodiment.

Figure 2:
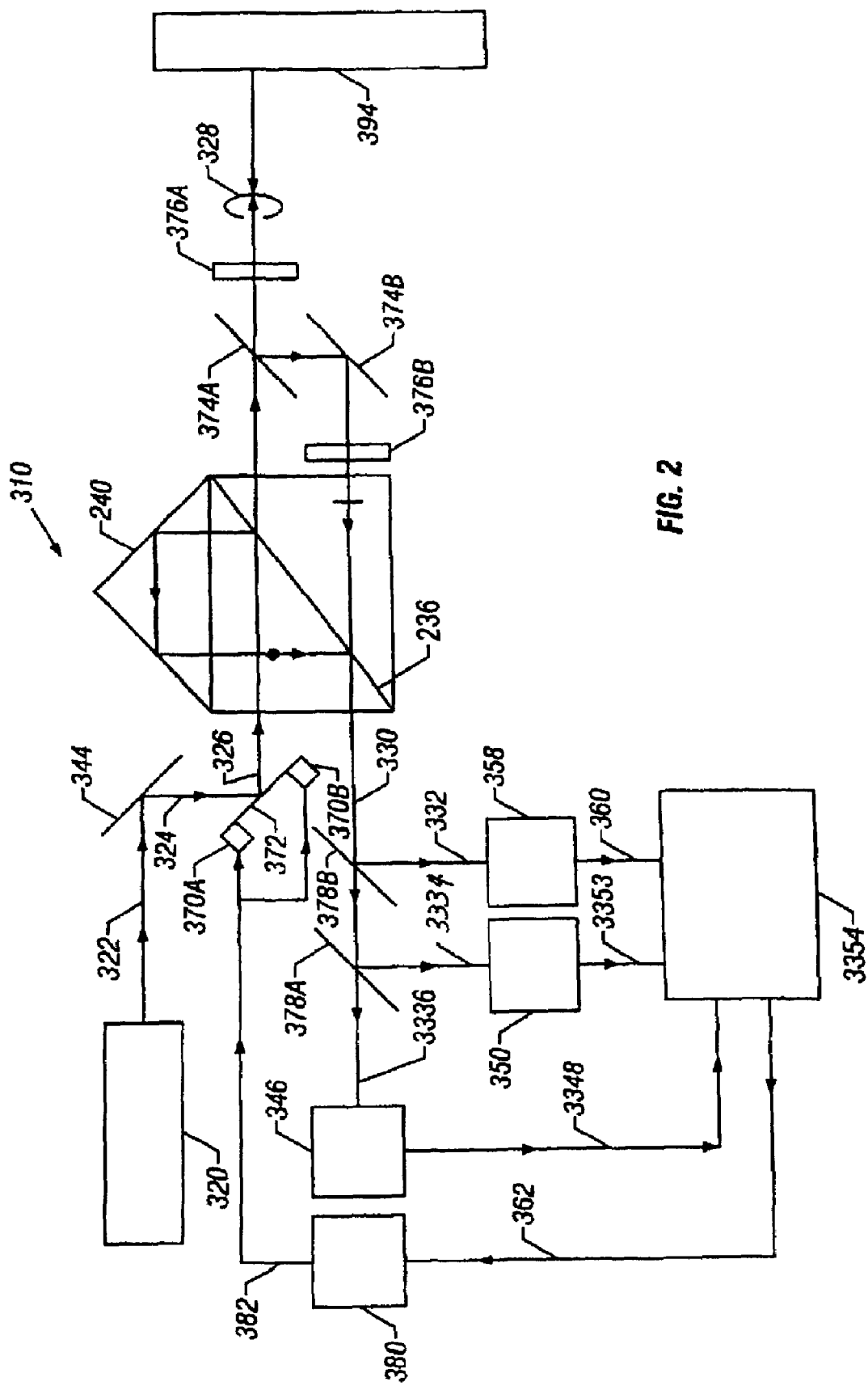
FIG. 2 is a schematic diagram of a third embodiment of the present invention.

FIG. 2 depicts in schematic form an apparatus and method in accordance with the third embodiment of the present invention for measuring and monitoring changes in displacement and orientation in a plane of a plane mirror measurement object wherein the propagation direction of a measurement beam is substantially orthogonal to the plane mirror. The interferometer system of the third embodiment comprises a polarizing, heterodyne, single pass interferometer with a dynamic beam-steering element generally depicted in FIG. 2 at 310, differential angle displacement interferometer 350, and angle displacement interferometer 358.

The third embodiment of the present invention comprises many elements of the first embodiment performing like functions as like numbered elements of the first embodiment. The third embodiment measures a linear displacement of mirror 394 and the change in orientation of mirror 394 in a plane wherein the propagation direction of measurement beam 328 is orthogonal to the surface of mirror 394 independent of changes in orientation of mirror 394 in the plane. In addition, there are substantially no shears of reference and measurement beams in single pass interferometer 310 and angle displacement interferometers 350 and 358. In addition, the shear of measurement beam 328 at mirror 394 is one quarter of the shear of the second pass measurement beam of a double pass plane mirror interferometer at the plane mirror measuring object for equivalent conditions with respect to a change in orientation of measuring object and to distance between the interferometers and the measuring object.

A first portion of output beam 330 is reflected by non-polarizing beam-splitter 378B as a first output beam 332 as shown in FIG. 2. A second portion of output beam 330 is transmitted by non-polarizing beam-splitter 378B and a first portion thereof is reflected by analyzer 378A as a second output beam 3334. A second portion of the second portion of output beam 330 transmitted by non-polarizing beam-splitter 378B is transmitted by non-polarizing beam-splitter 378A as a third output beam 3336. First output beam 332 is incident on angle displacement interferometer 358, second output beam 3334 is incident on differential angle displacement interferometer 350, and third output beam 3336 is incident on detector 346.

The description of the detection of third output beam 3336 and generation of heterodyne signal 3348 is the same as the corresponding portion of the description given for the detection of beam 336 and generation of heterodyne signal 348 of the first embodiment. The description of the processing of heterodyne signal 3348 for phase $\phi_1$ is the same as the corresponding portion of the description given for the processing of heterodyne signal 348 for phase $\phi_1$ of the first embodiment.

The description of the detection of second output beam 3334 and generation of heterodyne signal 3353 is the same as the corresponding portion of the description given for the detection of beam 334 and generation of heterodyne signal 353 of the first embodiment. The description of the processing of the second output beam 3334 for phase $(\phi_1+\phi_2)$ is the same as the corresponding portion of the description given for the processing of heterodyne signal 353 for phase $(\phi_1+\phi_2)$ of the first embodiment.

First output beam 332 is incident on angle displacement interferometer 358. Angle-displacement interferometer 358 is a non-differential type angle displacement interferometer used to introduce a relative phase shift $\phi_3$ between the measurement and reference beam components of first output beam 332. Relative phase shift $\phi_3$ is related to a change in directions of propagation $\alpha_2$ of the measurement and reference beam components of first output beam 332 in the plane of FIG. 2. Examples of angle displacement interferometers are described in detail below.

Differential angle displacement interferometer 350 and angle displacement interferometer 358 are oriented relative to each other so that the two angle displacement interferometers are sensitive to changes in the orientation of mirror 394 in a common plane.

Analyzer 3354 comprises the analyzers and processors of analyzer 354 of the first embodiment. Analyzer 3354 further comprises a processor that determines phase $(\phi_1+\phi_3)$ from heterodyne signal 360 by a phase meter using a reference phase from source 220. Next, analyzer 3354 computes phase $\phi_3$ as the difference $[(\phi_1+\phi_3)-\phi_1]$ and then computes a corresponding change $\beta_1$ in the propagation direction of first output beam 332 from the computed value of phase $\phi_3$.

A change $\gamma_1$ in angle of orientation of mirror 394 corresponding to changes in angles $\alpha_1$ and $\beta_1$ is related to angles $\alpha_1$ and $\beta_1$ by the formula $$\gamma_1 = \beta_1 + \frac{\alpha_1}{2}. \tag{4}$$

Analyzer 3354 comprises a processor that computes angle $\gamma_1$ according to Equation (4).

The remaining description of the third embodiment is the same as the corresponding description given for the first embodiment.

A fourth embodiment of the present invention is described for measuring and monitoring changes in displacement and orientation in two orthogonal planes of a plane mirror measurement object wherein the propagation direction of a measurement beam is substantially orthogonal to the plane mirror. The interferometer system of the fourth embodiment comprises the interferometer system of the third embodiment augmented with a second differential angle displacement interferometer and a second angle displacement interferometer. The description of the second differential angle displacement interferometer is the same as the corresponding portion of the description given for the differential angle displacement interferometer of the second embodiment. The description of the second angle displacement interferometer is the same as the corresponding portion of the description given for the angle displacement interferometer of the third embodiment.

The remaining description of the fourth embodiment is the same as the corresponding portions of the description given for the second and third embodiments of the present invention.

A fifth embodiment of the present invention is described for measuring and monitoring changes in displacement and orientation in one plane of a plane mirror measurement object. The fifth embodiment comprises the interferometer system of the first embodiment and a single pass interferometer. A portion of the output beam 330 of the first embodiment is split off and transmitted first through a retroreflector and then through a half-wave phase retardation plate to form an input beam for the single pass interferometer. Because of the properties of output beam 330 and because of the use of the retroreflector in the formation of the input beam for the single pass interferometer, the propagation direction of the measurement beam of the single pass interferometer is substantially normal to the surface of mirror 394 the same as that for propagation direction of beam 328.

The single pass interferometer introduces a phase $\phi_6$ between the measurement and reference beams of the single pass interferometer. As a result of the half-wave phase retardation plate, the reference beam component of 330 is the beam from which the measurement beam component of the output beam of the single pass interferometer is derived and the measurement beam component of 330 is the beam from which the reference beam component of the output beam of the single pass interferometer is derived. Thus the net phase difference between the measurement and reference beam components of the output beam of the single pass interferometer is equal to $(\phi_6-\phi_1)$. Phase difference $(\phi_6-\phi_1)$ is only sensitive to changes in the orientation of mirror 394 in a plane defined by the relative paths of measurement beam 328 and the measurement beam of the single pass interferometer. The change in angular orientation of mirror 394 is computed using the phase difference $(\phi_6-\phi_1)$ and a measured value for the special separation of measurement beam 328 and the measurement beam of the single pass interferometer.

The remaining description of the fifth embodiment is the same as corresponding portions of the description given for the description of the second embodiment of the present invention.

A sixth embodiment of the present invention is described for measuring and monitoring changes in displacement and orientation in two orthogonal planes of a plane mirror measurement object. The sixth embodiment comprises the interferometer system of the second embodiment and two single pass interferometers. The description of the first of the two single pass interferometers is the same as the corresponding portion of the description given for the fifth embodiment. A portion of the input beam to the first single pass interferometer is split off to form an input beam for the second of the two single pass interferometers. Because of the properties of output beam 330 and because of the use of the retroreflector in the formation of the input beam for the first of the two single pass interferometers, the propagation direction of the measurement beam of the second single pass interferometer is substantially normal to the surface of mirror 394.

The second single pass interferometer introduces a phase $\phi_7$ between the measurement and reference beams of the single pass interferometer. As a result of the half-wave phase retardation plate, the reference beam component of 330 is the beam from which the measurement beam component of the output beam of the single pass interferometer is derived and the measurement beam component of 330 is the beam from which the reference beam component of the output beam of the single pass interferometer is derived. Thus the net phase difference between the measurement and reference beam components of the output beam of the second single pass interferometer is equal to $(\phi_7-\phi_1)$. Phase difference $(\phi_7-\phi_1)$ is only sensitive to changes in the orientation of mirror 394 in a second plane defined by the relative paths of measurement beam 328 and the measurement beam of the second single pass interferometer. The second plane is preferably orthogonal to the first plane defined by the relative paths of measurement beam 328 and the measurement beam of the first single pass interferometer. The change in angular orientation of mirror 394 in the second plane is computed using the phase difference $(\phi_7-\phi_1)$ and a measured value for the special separation of measurement beam 328 and the measurement beam of the second single pass interferometer.

The remaining description of the sixth embodiment is the same as the corresponding portions of the description given for the fifth embodiment.

Embodiments of the invention may further include any of the features in any of the following commonly owned U.S. patent applications or patents, which relate, at least in part, to interferometry systems that minimize beam shear: U.S. Pat. No. 6,271,923 issued Aug. 7, 2001 to Henry A. Hill; Published PCT Application WO 00/66969 corresponding to PCT/US00/12097 by Henry A. Hill; U.S. Pat. No. 6,313,918 B1 by Henry A. Hill et al.; Provisional Patent Application No. 60/356,393 by Henry A. Hill entitled "INTERFEROMETER WITH DYNAMIC BEAM STEERING ELEMENT REDIRECTING INPUT MEASUREMENT BEAM COMPONENT AND OUTPUT REFERENCE BEAM COMPONENT," filed Feb. 12, 2002; and U.S. patent application Ser. No. 10/207,314 by Henry A. Hill entitled "PASSIVE ZERO SHEAR INTERFEROMETERS" filed Jul. 29, 2002.

We now describe examples of differential angle displacement interferometers and angle displacement interferometers.

Figure 3A:
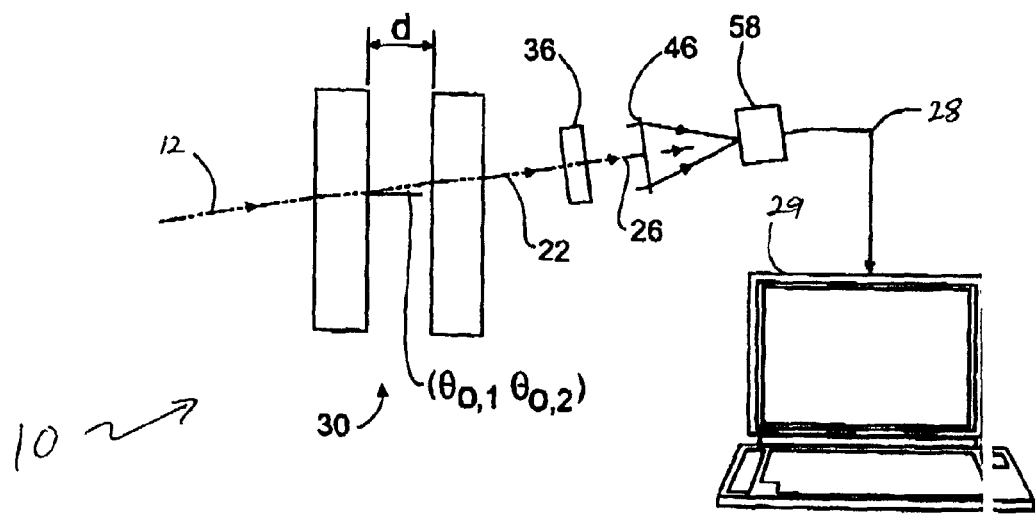
FIG. 3A–FIG. 3B are schematic diagrams of a differential angle displacement interferometer.

A differential angle displacement interferometer 10 is shown schematically in FIG. 3A. Input beam 12 comprises two orthogonally polarized components having a difference in frequencies of $f_1$. Input beam 12 corresponds to, e.g., output beam 334 in the first embodiment of the invention, as shown in FIG. 1A. The planes of polarization of the two orthogonally polarized components are at angles of 45° to the plane of FIG. 3A. The directions of propagation of the two components of input beam 12 may be the same or different one from the other. Input beam 12 impinges on an etalon generally indicated by element number 30 with a gap d. The angles of incidence of the first and second components of input beam 12 at the interior faces of etalon 30 are $\theta_{o,1}$ and $\theta_{o,2}$, respectively. Angles $\theta_{o,1}$ and $\theta_{o,2}$ are selected so that the transmission of the first and second components of input beam 12 by etalon 30 are each substantially at a maximum excluding the maximum in transmission possible at $\theta_{o,j}=0$ for j=1,2. For the first embodiment, the difference angle $(\theta_{o,2}-\theta_{o,1})<<$ than the angular width of the corresponding transmission peak.

The first and second components of input 12 are transmitted as first and second orthogonally polarized beam components of output beam 22. Output beam 22 is transmitted by polarizer 36 to form mixed beam 26. Mixed beam 26 is focused by lens 46 to an image spot on detector 58. The beam forming the image spot is detected, preferably by photoelectric detection, by detector 58 as electrical interference signal 28 (corresponding to, e.g., heterodyne signal 353 in FIG. 1A).

Signal 28 is a heterodyne signal having a heterodyne frequency equal to $f_1$, the difference in frequencies of the first and second components of input beam 12, and a heterodyne phase $\phi_{1,2}$. Heterodyne phase $\phi_{1,2}$ corresponds to, e.g., phase $\phi_2$ in the first embodiment and to phase $\phi_{20}$ in the second embodiment. Signal 28 is processed by, e.g., analyzer 354 (see FIG. 1A) or other suitable electronic processor.

For a non-limiting example of a non-apodized square aperture at lens 46, the intensity profile $I_{h,1}$ at the image spot in the plane of FIG. 3A for components of beam 26 responsible for heterodyne signal 28, is written to a good approximation as $$I_{h,1} = \frac{C_{h,1}(1-R_1)^2}{[(1-R_1)^2+4R\sin^2(\delta'_{1,2}/2)]} \times \mathrm{sinc}^2[kp_{1,2}(b/2)]\cos[\omega_1 t+(\phi_2-\phi_1)] \tag{5}$$

where $$\delta'_j = 2knd(p_j\tan\theta_{o,j}+\cos\theta_{o,j}), j=1,2, \tag{6}$$

$$p_j = \sin\theta_{o,j}+\sin\theta_{i,j}, j=1,2, \tag{7}$$

$$\tan\phi_j = \frac{R_1\sin\delta_j}{1-R_1\cos\delta_j}, j=1,2, \tag{8}$$

Figure 3B:
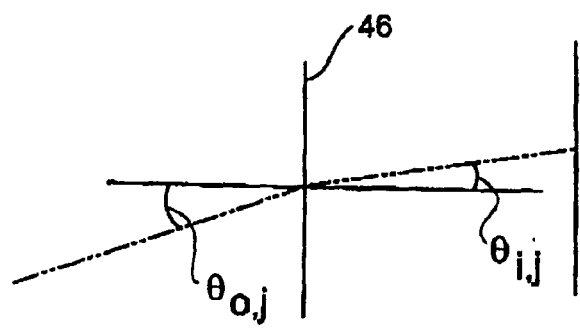

$\delta'_{1,2}=(\delta'_2+\delta'_1)/2$, $p_{1,2}=(p_2+p_1)/2$, b is the width of the square aperture at lens 46 in the plane of FIG. 3A, $C_{h,1}$ is a proportionality constant, $R_1$ is the intensity reflectivity of the interior surfaces of etalon 30, $\omega_1=2\pi f_1$, and k and n are, respectively, the wavenumber of the input beam components and the index of refraction of a medium in the gap of etalon 30. Angles $\theta_{o,1}$ and $\theta_{o,2}$ are defined according to FIG. 3B.

Heterodyne signal 28 is proportional to the integral of $I_{h,1}$ over the image spot. At a transmission peak, i.e. $\delta'_j \cong 2q_j\pi$ where $q_j$ is an integer typically >>1 and $\phi_j \cong 2\,q'_j\pi$ where $q'_j$ is an integer, sensitivity of heterodyne phase $\phi_{1,2}$ to changes in $\theta_{o,1}$ and $\theta_{o,2}$ may be expressed as $$d\varphi_{1,2} = -\frac{R_1}{(1-R_1)}2knd\left[\sin\left(\frac{\theta_{o,2}+\theta_{o,1}}{2}\right)\right](d\theta_{o,2}-d\theta_{o,1}). \tag{9}$$

In order to reduce complexity in the display of general properties of the invention without departing from the scope or spirit of the invention, higher order terms in Eq. (9) have been omitted.

Heterodyne phase, $\phi_{1,2}=\phi_2-\phi_1$, may be obtained through the use of time based phase analysis procedures such as with a Hilbert transform or the like.

For an etalon spacing of d=4 mm, $R_1$=0.99, $\lambda$=633 nm, n=1.000, and $[(\theta_{o,2}+\theta_{o,1})/2]$=0.0129 rad, sensitivity of phase $\phi_{1,2}$ to changes in $\theta_{o,1}$ and $\theta_{o,2}$ is $$d\phi_{1,2}=-1.01\times10^5(d\theta_{o,2}-d\theta_{o,1}). \tag{10}$$

Or expressed in terms of sensitivity of inferred values for $(d\theta_{o,2}-d\theta_{o,1})$ from measured changes in phase $\phi_{1,2}$, $$(d\theta_{o,2}-d\theta_{o,1})=-0.99\times10^{-5}d\phi_{1,2}. \tag{11}$$

It is evident for the first embodiment that the measurement of a difference in angle $(d\theta_{o,2}-d\theta_{o,1})$ is based on an optical differencing technique wherein the measured phase difference between a first and second beam components is not sensitive in first order to effects of a frequency shift common to both the first and second beam components.

Improved accuracy in measurements of relative changes in directions of propagation of input beam components can be obtained by operating at a low frequency split between the first and second beam components. The option to use a low frequency split in certain end use applications is a direct consequence of the absence of first order input beam frequency shift effects in the phase of heterodyne signal 28 used to measure and monitor changes in relative directions of propagation of components of input beam 12.

The phase of the electrical interference signal used to measure and monitor changes in direction of propagation of the input beam may be determined using either a heterodyne technique as described or a homodyne technique when frequency $f_1 \cong 0$.

Differential angle displacement interferometer 10 can be used as a null detector without accurate knowledge of the coefficient of $d\phi_{1,2}$ in Equation (11). With the calibration of the coefficient of $d\phi_{1,2}$ in Equation (11), the first embodiment can be used to measure relative changes in the direction of propagation of the first and second components of input beam 12 that are less than the width of the corresponding transmission peak.

Figure 4:
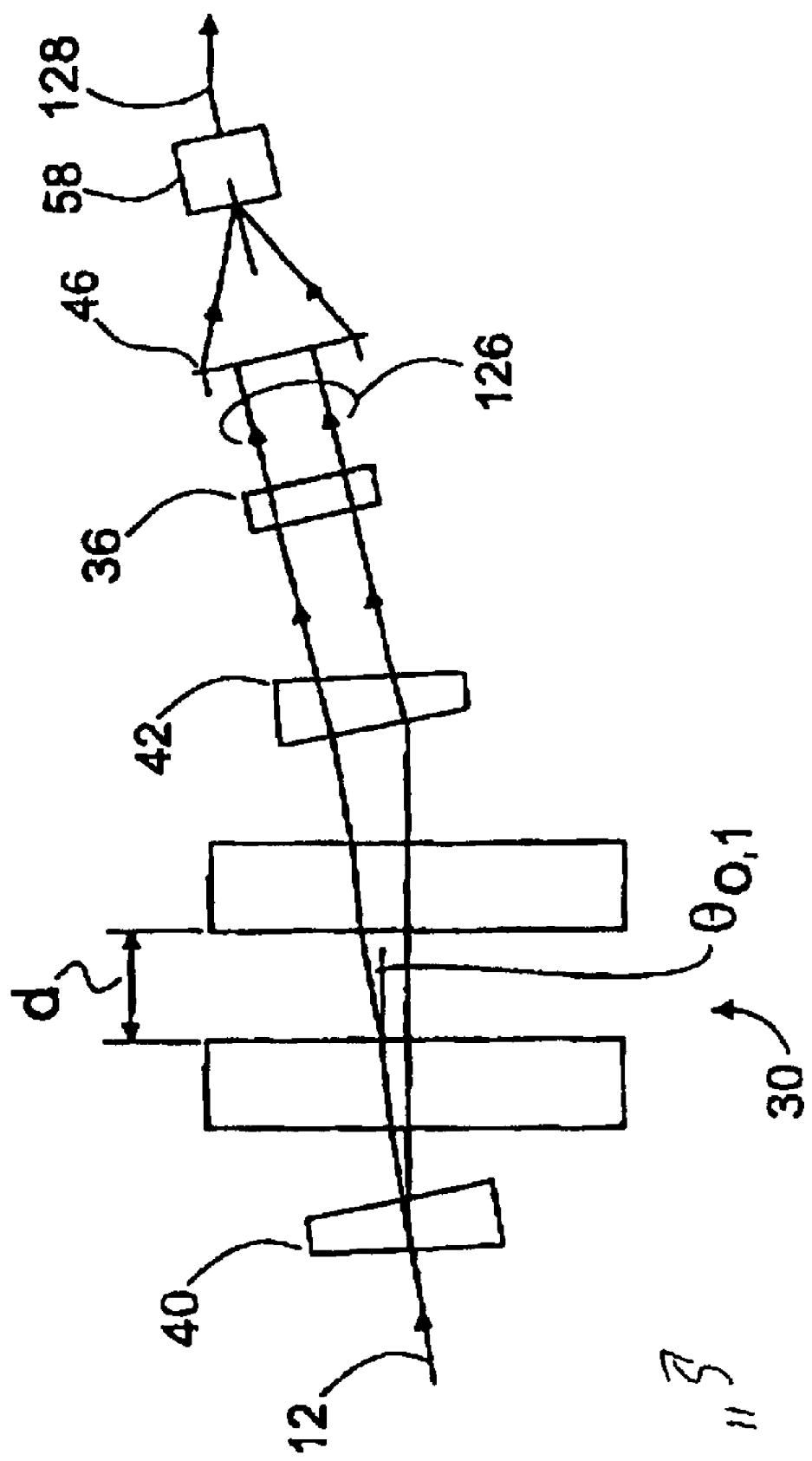
FIG. 4 is a schematic diagram of an angle displacement interferometer.

Differential angle displacement interferometer 10 can be modified to provide angle displacement interferometer 11, shown schematically in FIG. 4. Apparatus of the second embodiment comprises the same components as the apparatus of the first embodiment and two birefringent prisms 40 and 42. Birefringent prism 40 introduces an angle between the first and second components of input beam 12 such that $\theta_{o,1}$ and $\theta_{o,2}$ correspond to two different transmission peaks of etalon 30. Birefringent prism 42 recombines beams out of etalon 30 so that first and second components of the output beam 126 associated with the first and second components of input beam 12, respectively, have substantially parallel directions of propagation. For example, if $\theta_{o,2}=0$ for the second embodiment, then the sensitivity of phase $\phi_{1,2}$ to changes in $\theta_{o,1}$ is expressed by Equations (9) and (10) with $d\theta_{o,2}=0$. Likewise, sensitivity of inferred values for $d\theta_{o,1}$ from measured changes in phase $\phi_{1,2}$ is expressed by Equation (11) with $d\theta_{o,2}=0$.

Thus, with the calibration of the coefficient of in Equation 7, the second embodiment can be used to measure changes in the direction of propagation of the first component of the input beam 12 with respect to an orientation of the apparatus of the second embodiment. It will be evident to those skilled in the art that the second embodiment can equally well be been configured to measure changes in the direction of propagation of the second component of input beam 12.

The remaining description of angle displacement interferometer 11 is the same as corresponding portions of differential angle-measuring interferometer 10.

Figure 5A:
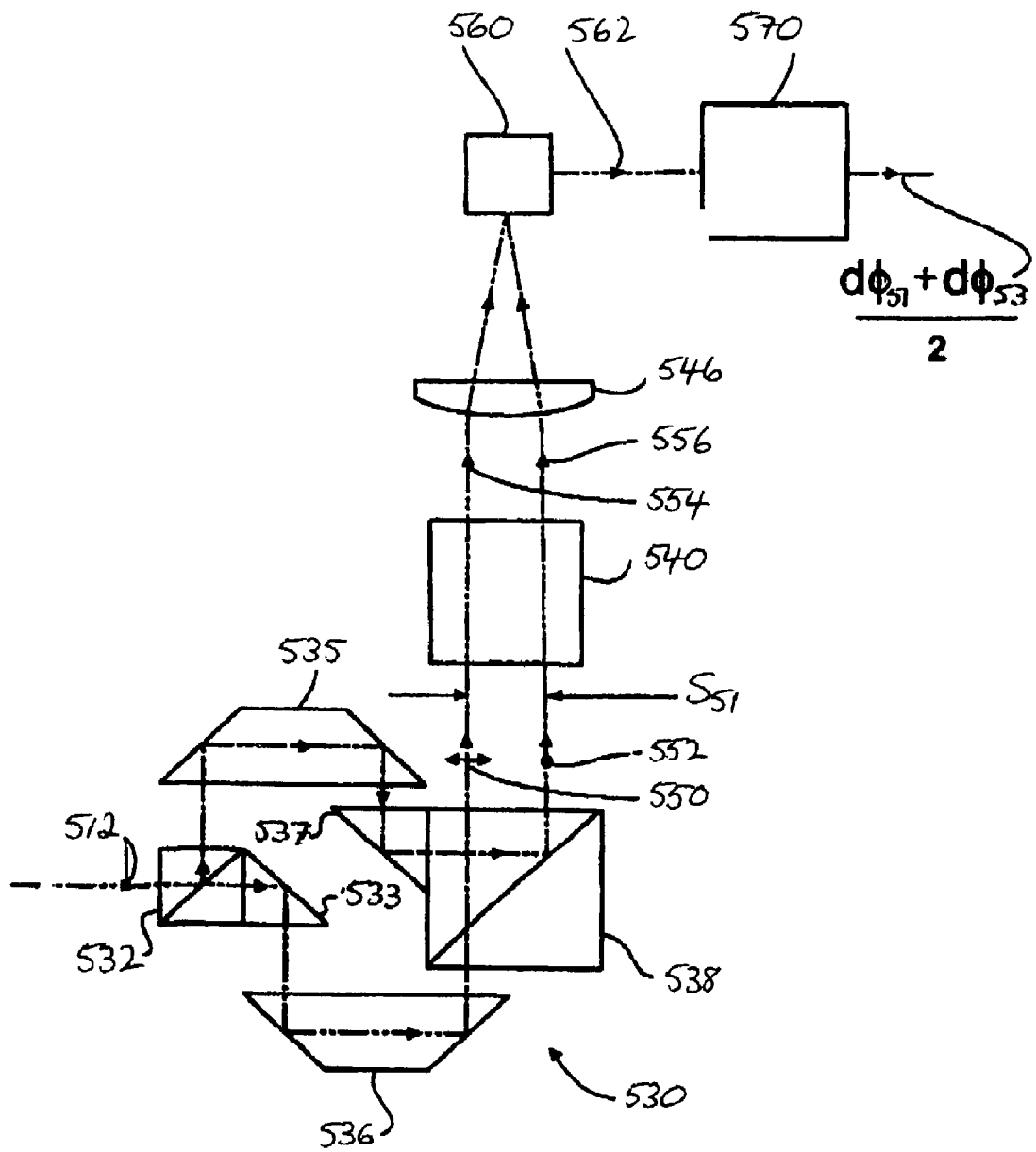

An alternative angle displacement interferometer 500 is shown schematically in FIG. 5A and makes angle measurements in one plane of the average direction of propagation of an optical beam comprising two components. Angle-displacement interferometer 500 comprises beam-shearing assembly generally shown at element numeral 530, analyzer 540, lens 546, detector 560, and electronic processor 570. Input beam 512, which corresponds to, e.g., first output beam 332 (see FIG. 2), comprises two orthogonally polarized optical beam components having a difference in frequencies of $f_1$. The planes of polarization of the two orthogonally polarized components are parallel and orthogonal to the plane of FIG. 5A, respectively.

Beam-shearing assembly 530 introduces a lateral shear $S_{51}$ between the two orthogonally polarized beams 550 and 552, respectively (see FIG. 5A). A portion of each of the spatially sheared output beams 550 and 552 are transmitted by analyzer 540 as components 554 and 556, respectively. Analyzer 540 is orientated so that beam components 554 and 556 are both polarized in a common plane orientated at 45 degrees to the plane of FIG. 5A.

Next, beam components 554 and 556 are incident on lens 546 wherein lens 546 focuses beam components 554 and 556 to spots on detector 560 to be detected preferably by a quantum photon detector to generate electrical interference signal 562 or heterodyne signal $s_{51}$. The spots substantially overlap. Heterodyne signal $s_{51}$ is transmitted to electronic processor 570 (e.g., analyzer 3354 in FIG. 2) for determination of the heterodyne phase of signal $s_{51}$ and a corresponding average direction of propagation of beam 512 in the plane of FIG. 5A.

Beam-shearing assembly 530 comprises polarizing beam-splitters 532 and 538, right angle prisms 533 and 537, and truncated Porro prisms 535 and 536. The component of beam 512 polarized in the plane of FIG. 5A is transmitted by polarizing beam-splitter 532, reflected by right angle prism 533, redirected by truncated Porro prism 536, and reflected by polarizing beam-splitter 538 as beam 550. The component of beam 512 polarized orthogonal to the plane of FIG. 5A is reflected by polarizing beam-splitter 532, redirected by truncated Porro prism 535, reflected by right angle prism 537, and transmitted by polarizing beam-splitter 538 as beam 552.

Note that the optical path in glass for each of beams 554 and 556 through beam-shearing assembly 530 and analyzer 540 are preferably the same. This feature of the apparatus design of angle displacement interferometer 500 produces a high stability interferometer system with respect to changes in temperature.

Heterodyne signal $s_{51}$ may be written as $$s_{51}=A_{51}\cos(\omega_{51}t+\phi_{51}+\xi_{51}) \quad (12)$$

where $$\phi_{51}=2k_{51}n[d_{51}\cos\theta'_{51}+d_{52}\cos\theta'_{52}-d_{53}\cos\theta'_{53}-d_{54}\cos\theta'_{54}], \quad (13)$$

Figure 5B:
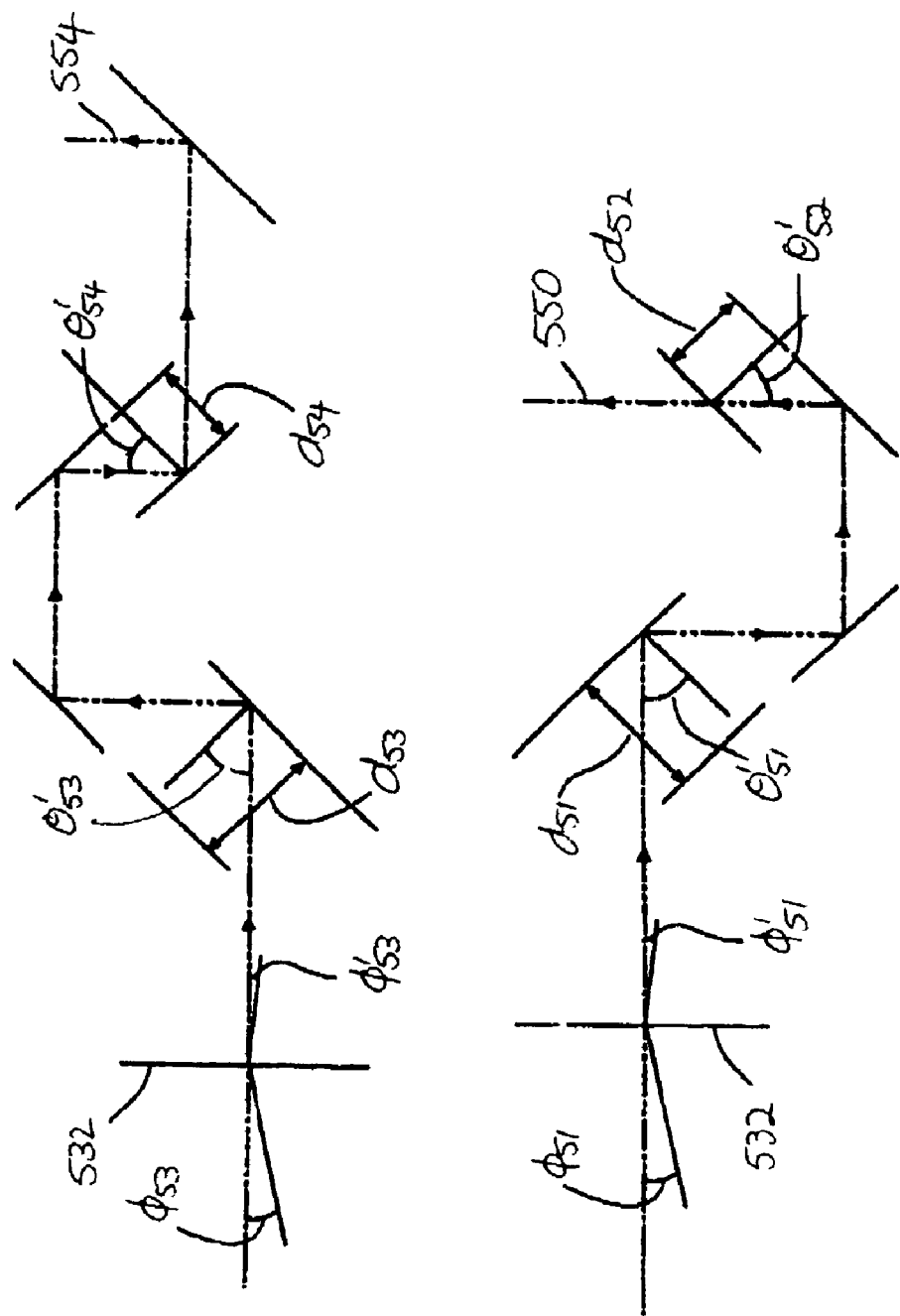

$\omega_{51}=2\pi f_{51}$, $\xi_1$ is an offset phase not associated with phase $\phi_{51}$, $k_{51}=2\pi/\lambda_{51}$, $\lambda_{51}$ is the wave length of input beam 512, $\theta'_{51}$ and $\theta'_{52}$ are angles of incidence of beam 550 at right angle prism 533 and at the polarizing beam-splitter 538, respectively, (see FIG. 5B), $\theta'_{53}$ and $\theta'_{54}$ are angles of incidence of beam 552 at polarizing beam-splitter 532 and at right angle prism 537, respectively, (see FIG. 5B), and $d_{51}$, $d_{52}$, $d_{53}$, and $d_{54}$ are defined in FIG. 5B$b$. Note that $\phi_{51}$ corresponds to, e.g., $\phi_3$ in the third embodiment. It has been assumed in Equation (13) for the purposes of demonstrating the features of the present invention in a simple fashion without departing from the scope and spirit of the present invention that all of the optical paths in beam-shearing assembly 530 have the same index of refraction. For a non-limiting example of $d_{51}=d_{53}$, $d_{52}=d_{54}$, $\theta'_{51}+\theta'_{52}=\pi/2$, and $\theta'_{53}+\theta'_{54}=\pi/2$, Equation (13) reduces to the simpler expression for $\phi_{51}$, $$\varphi_{51} = 2^{1/2}k_{51}n\begin{bmatrix}(d_{51}-d_{52})[\cos(\theta'_{51}+\pi/4)+\cos(\theta'_{54}+\pi/4)]+\\(d_{51}+d_{52})[\sin(\theta'_{51}+\pi/4)-\sin(\theta'_{54}+\pi/4)]\end{bmatrix}. \quad (14)$$

Lateral shear $S_{51}$ is related to properties of beam-shearing assembly 530 according to the equation $$S_{51}=2\begin{bmatrix}(d_{51}\sin\theta'_{51}-d_{52}\sin\theta'_{52})\sec\phi'_{51}\cos\phi_{51}+\\(d_{53}\sin\theta'_{53}-d_{54}\sin\theta'_{54})\sec\phi'_{53}\cos\phi_{53}\end{bmatrix} \quad (15)$$

where $\phi_{51}$ and $\phi'_{51}$ are the angles of incidence and refraction of beam 550 at entrance facet of polarizing beam-splitter 532 and $\phi_{53}$ and $\phi'_{53}$ are the angles of incidence and refraction of beam 552 at entrance facet of polarizing beam-splitter 532 (see FIG. 5B). For the non-limiting example, $$S_{51}=2^{1/2}\left\{(d_{51}-d_{52})\begin{bmatrix}\sin(\theta'_{51}+\pi/2)\sec\phi'_{51}\cos\phi_{51}+\\\sin(\theta'_{54}+\pi/2)\sec\phi'_{53}\cos\phi_{53}\end{bmatrix}+\\(d_{51}+d_{52})\begin{bmatrix}\sin(\theta'_{51}-\pi/2)\sec\phi'_{51}\cos\phi_{51}-\\\sin(\theta'_{54}-\pi/2)\sec\phi'_{53}\cos\phi_{53}\end{bmatrix}\right\}. \quad (16)$$

The expression given for $S_{51}$ by Equations (15) and (16) represent the primary mechanism used for generation of the beam shear. However, there are other mechanisms for introducing a beam shear such as associated with angle of incidence dependent phase shifts (Goos-Hänchen effect).

Figure 5C:
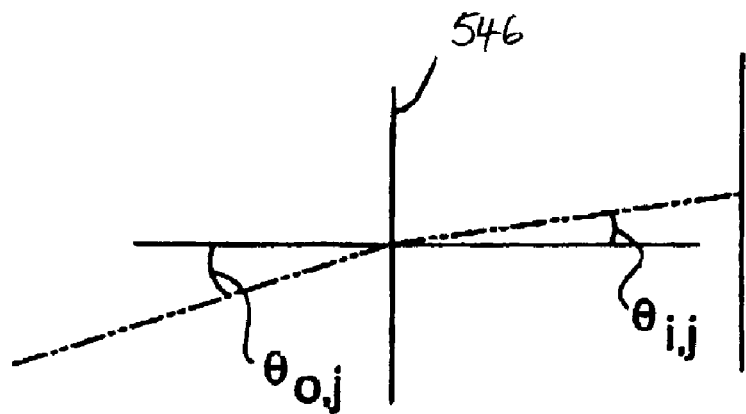
Figure 5D:
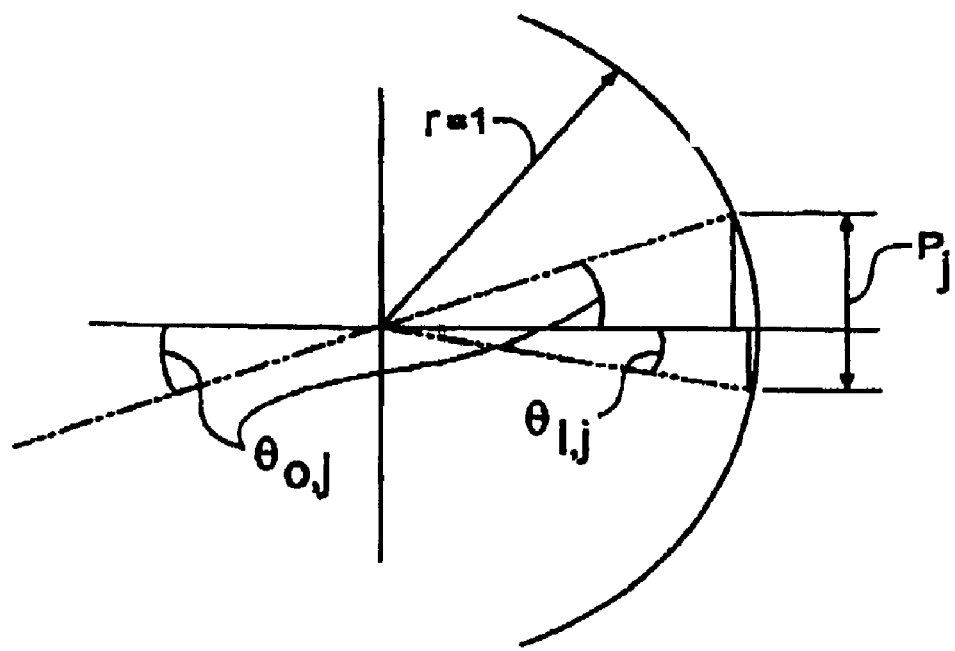

Amplitude $A_{51}$ is proportional to a good approximation to a Fourier component of the Fourier transform of $|h(p_{51})|^2$, i.e., $$A_{51} \propto \int |h(p_{51})|^2 \cos[4k_{51} p_{51} S_{51}] dp_{51} \quad (17)$$

where $h(p_{51})$ is the Fourier transform of the amplitude of one of the beams 554 or 556 at lens 546 multiplied by the pupil function of lens 546, $$p_j = \sin \theta_{o,j} + \sin \theta_{i,j} \quad j=51,52 \ldots, \quad (18)$$

and the definition of $\theta_{o,j}$ and $\theta_{i,j}$ are shown in FIG. 5C. Angles $\theta_{o,j}$ and $\theta_{i,j}$ are conjugate angles of principle rays of beam j in the object and image space of lens 546. The definition of $p_j$ is shown in FIG. 5D.

It is evident from Equations (13) and (14) that the resolution of phase $\phi_{51}$ in terms of a change in a direction of an optical beam is increased as the length $2^{3/2}(d_{51}-d_{52})$ is increased. However, the usable range for $2^{3/2}(d_{51}-d_{52})$ is defined by the spatial frequency bandwidth of the Fourier transform of $|h(p_{51})|^2$ as shown by Equation. (17).

The optimum value for $2^{3/2}(d_{51}-d_{52})$ is generally equal to approximately one half a characteristic spatial dimension of a beam transmitted by a respective pupil. Consider, for example, the case of a rectangle pupil of dimension b in the plane of FIG. 5A for both beam 554 and beam 556 at lens 546 and the amplitudes of beams 554 and 556 being uniform across respective pupils. For this case, $|h(p_{51})|^2$ is a sinc function squared, i.e. $(\sin x/x)^2$, and the Fourier transform of $|h(p_{51})|^2$ is a triangle function $\Lambda$. Triangle function $\Lambda$ has a maximum value of 1 for $2^{3/2}(d_{51}-d_{52})=0$ and has a value of 0 for $2^{3/2}(d_{51}-d_{52}) \geq b$. Therefore, amplitude $A_{51}=0$ for $2^{3/2}(d_{51}-d_{52}) \geq b$ and the resolution of phase $\phi_{51}$ in terms of a change in a direction of an optical beam is 0 for $2^{3/2}(d_{51}-d_{52})=0$. Thus the optimum value for $2^{3/2}(d_{51}-d_{52})$ is in this case approximately b/2. The actual optimum value for $2^{3/2}(d_{51}-d_{52})$ will depend on the criterion used to define an optimum operating condition with respect to a signal-to-noise ratio, for example. For the case where the components of beam 512 have Gaussian intensity profiles, the optimum value for $2^{3/2}(d_{51}-d_{52})$ will be approximately w where w is the radius at which the intensity of beam 512 has a value equal to 1/e of the intensity at beam 512 at its center.

For an example of a beam having a Gaussian intensity profile with 2w=5.0 mm, $\theta_{51}=45$ degrees, and $\lambda_{51}=633$ nm, the sensitivity of the phase $\phi_{51}$ to changes in $d\phi_{51}$ and $d\phi_{53}$ expressed in differential form is given by the equation $$d\varphi_{51} = k_{51} w \left[ \frac{d\phi_{51} + d\phi_{53}}{2} \right] \quad (19)$$

$$= -2.5 \times 10^4 \left[ \frac{d\phi_{51} + d\phi_{53}}{2} \right].$$

Note, as evident from Equation (19) that the sensitivity of the change in phase $\phi_{51}$ with respect to changes in angles $d\phi_{51}$ and $d\phi_{53}$ is independent of the index of refraction n. This is an important property of the first embodiment. In particular, the sensitivity of the change in phase $\phi_{51}$ with respect to changes in angles $d\phi_{51}$ and $d\phi_{53}$ has a sensitivity to temperature changes that is independent in first order to thermal induced changes in the refractive index of the optical elements of beam-shearing assembly 530 and only dependent on thermal coefficients of expansion of the optical elements of beam-shearing assembly 530. The thermal coefficients of the elements of beam-shearing assembly 530 can be selected to be less than $\leq 0.5$ ppm/° C. For similar reasons, the zero value of $\phi_{51}$ also exhibits a corresponding low sensitivity to changes in temperature of beam-shearing assembly 530.

The two primary quantities that place restrictions on the range of average value $[d\phi_{51}+d\phi_{53}]/2$ that can be accommodated by the first embodiment are the magnitude of the difference $[d\phi_{51}-d\phi_{53}]/2$ and the size of the sensitive area of detector 560. The amplitude of the heterodyne signal will be reduced by a factor of approximately 2 when $$w k_{51} \left[ \frac{d\phi_{51} - d\phi_{53}}{2} \right] \approx 1.$$

The higher terms in $d\phi_{51}$ and $d\phi_{53}$ that are omitted in Equation (19) can be easily determined from Eq. (13) if required for a particular end use application.

A second embodiment of beam-shearing assembly 530 is shown diagrammatically in FIG. 5E and comprises two prisms 5330 and 5332 and polarization beam-splitter interface 5340. A first component of input beam 512 is transmitted twice by polarization beam-splitter interface 5340 and reflected by facets of prisms 5330 and 5332 to form output beam 5350. A second component of input beam 512 is reflected twice by polarization beam-splitter interface 5340 and reflected by facets of prisms 5330 and 5332 to form output beam 5352.

The two prisms 5330 and 5332 and polarization beam-splitter interface 5340 exhibit properties the same as a Penta prism with respect to relationship of the direction of propagation of beam 512 and the directions of propagation for beams 5350 and 5352. Prisms 5330 and 5332 are preferably isomorphic with relative sizes selected to introduce a beam shear $S_{53}$ between beams 5350 and 5352. The optical paths in refractive media are substantially the same for beam 5350 and 5352. The remaining descriptions of beams 5350 and 5352 are the same as the corresponding portion of the descriptions given for beams 550 and 552 of the first embodiment with shear $S_{51}$ replaced by shear $S_{53}$. The description of input beam 512 in FIG. 5E is the same as the description of input beam 512 of the angle displacement interferometer shown in FIG. 5A.

Figure 6:
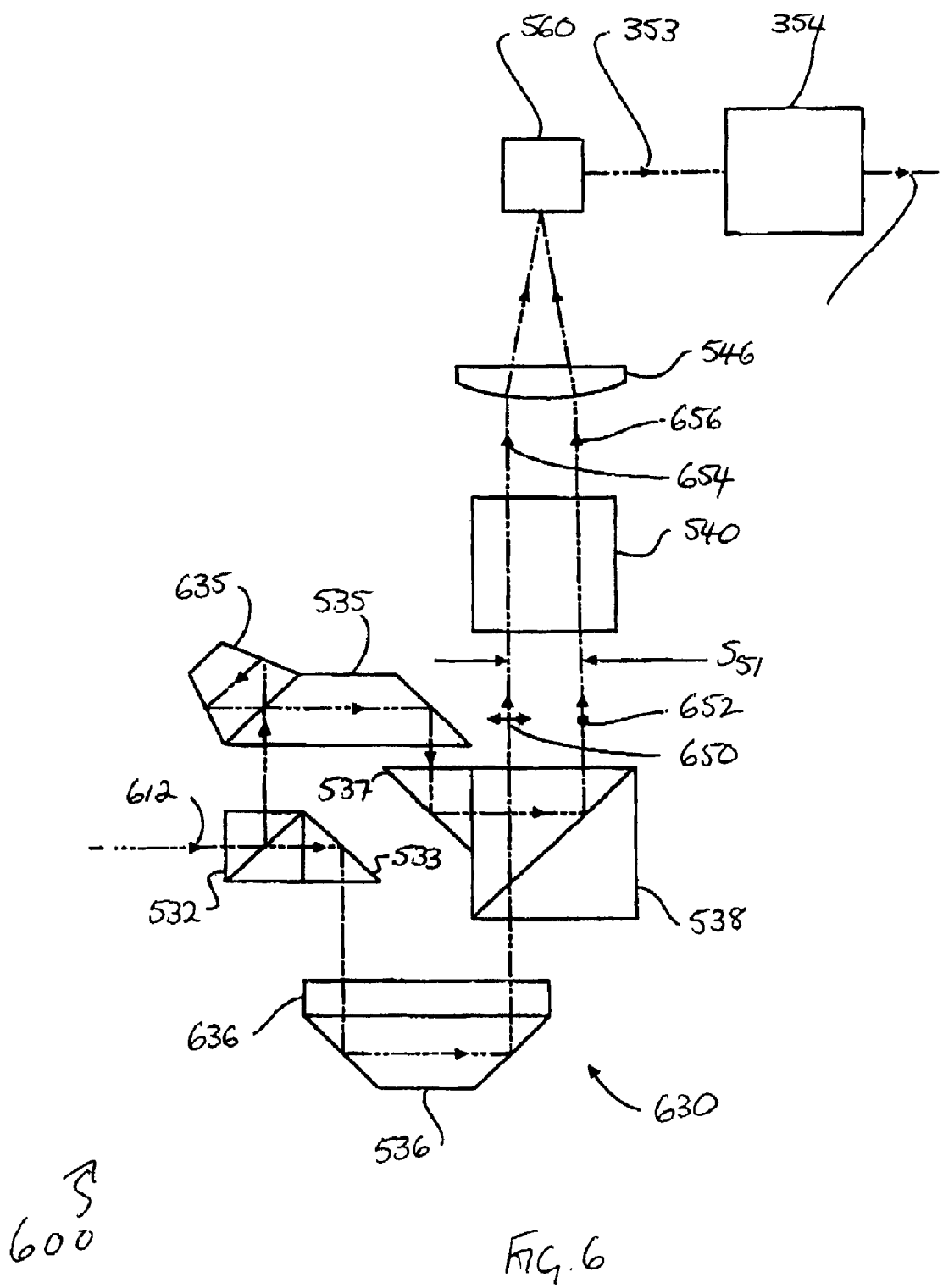
FIG. 6 is a schematic diagram of another differential angle displacement interferometer.

Another example of a differential angle displacement interferometer, labeled by reference numeral 600, is shown schematically in FIG. 6 and makes angle measurements in one plane of the difference in direction of propagation of components of a two component optical beam. The differential angle displacement interferometer 600 comprises beam-shearing assembly generally shown at element numeral 630, analyzer 540, lens 546, detector 560, and electronic processor 570. The description of input beam 612 is the same as the corresponding portion of the description given for input beam 512, shown in FIG. 5A.

Beam-shearing assembly 630 comprises many elements having the same the element number as elements of the beam-shearing assembly 530 of the angle displacement interferometer 500 performing like functions. Beam-shearing assembly 630 further comprises Penta prism 635 and compensating plate 636. Penta prism 635 introduces an additional reflection in the optical path of beam 652 that results in an image inversion of beam 652 about a normal to the plane of FIG. 6. Associated with the image inversion is a propagation direction transformation wherein a change in direction of propagation of the component of input beam 612 reflected by polarizing beam-splitter 532 is transformed into an opposite change in direction of propagation of beam 652 in the plane of FIG. 6. The thickness of compensating plate 636 is selected such that the optical path in glass for beams 650 and 652 in beam-shearing assembly 630 are the same. The remaining description of beams 650 and 652 is the same as corresponding portions of the description given for beams 550 and 552 with respect to angle displacement interferometer 500.

The angle measured by differential angle displacement interferometer 600 is the difference in changes in directions of propagation $[d\phi_{51}-d\phi_{53}]/2$ of the two components of input beam 612 as a result of the image inversion of beam 652 introduced by the addition of Penta prism 635.

The remaining description of differential angle displacement interferometer 600 is the same as corresponding portions of the description given for angle displacement interferometer 500.

Alternatively, or additionally, other forms of angle interferometers, such as described in commonly owned U.S. patent applications having Ser. No. 09/842,556 filed Apr. 26, 2001 and entitled "DYNAMIC ANGLE MEASURING INTERFEROMETER," and Ser. No. 09/852,369 filed May 10, 2001 and entitled "APPARATUS AND METHOD FOR INTERFEROMETRIC MEASUREMENTS OF ANGULAR ORIENTATION AND DISTANCE TO A PLANE MIRROR OBJECT," both by Henry A. Hill, and Provisional Patent Application 60/351,496, filed on Jan. 24, 2002, entitled "INTERFEROMETERS FOR MEASURING CHANGES IN OPTICAL BEAM DIRECTION," by Henry A. Hill and Justin Kreuzer, may be incorporated in the above-described embodiments without departing from the spirit and scope of the present invention, the contents of the three cited patent applications being incorporated herein by reference.

The interferometry systems described above provide highly accurate measurements. Such systems can be especially useful in lithography applications used in fabricating large scale integrated circuits such as computer chips and the like. Lithography is the key technology driver for the semiconductor manufacturing industry. Overlay improvement is one of the five most difficult challenges down to and below 100 nm line widths (design rules), see for example the *Semiconductor Industry Roadmap*, p82 (1997).

Overlay depends directly on the performance, i.e. accuracy and precision, of the distance measuring interferometers used to position the wafer and reticle (or mask) stages. Since a lithography tool may produce $50–100M/year of product, the economic value from improved performance distance measuring interferometers is substantial. Each 1% increase in yield of the lithography tool results in approximately $1M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

Interferometry systems are important components of the positioning mechanisms that control the position of the wafer and reticle, and register the reticle image on the wafer. If such interferometry systems include the features described above, the accuracy of distances measured by the systems increases as error contributions to the distance measurement are minimized.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Interferometry systems described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

Figure 7A:
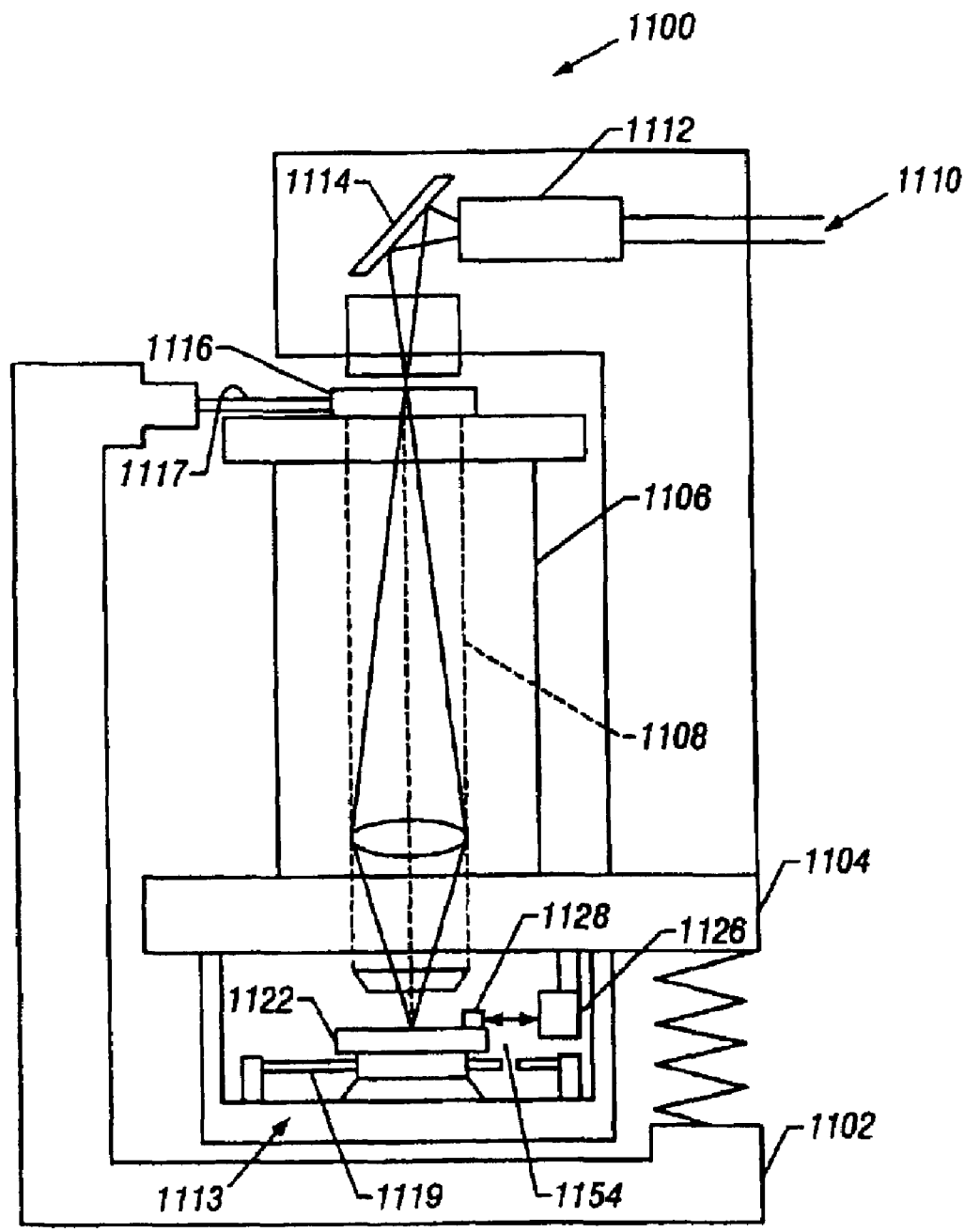
FIG. 7A is schematic diagram of a lithography system that includes an interferometry system described herein and is used to make integrated circuits.

An example of a lithography scanner 1100 using an interferometry system 1126 is shown in FIG. 7a. The interferometry system is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 1104 is a support base 1113 that carries wafer stage 1122. Stage 1122 includes a plane mirror 1128 for reflecting a measurement beam 1154 directed to the stage by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to the interferometry system, which is mounted on exposure base 1104. The interferometry system can be any of the embodiments described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other embodiments of the lithographic scanner, one or more of the interferometry systems described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the lithographic scanner can include what is known in the art as a column reference. In such embodiments, the interferometry system 1126 directs the reference beam (not shown) along an external reference path that contacts a reference mirror (not shown) mounted on some structure that directs the radiation beam, e.g., lens housing 1106. The reference mirror reflects the reference beam back to the interferometry system. The interference signal produce by interferometry system 1126 when combining measurement beam 1154 reflected from stage 1122 and the reference beam reflected from a reference mirror mounted on the lens housing 1106 indicates changes in the position of the stage relative to the radiation beam. Furthermore, in other embodiments the interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than, scanners.

Figure 7B:
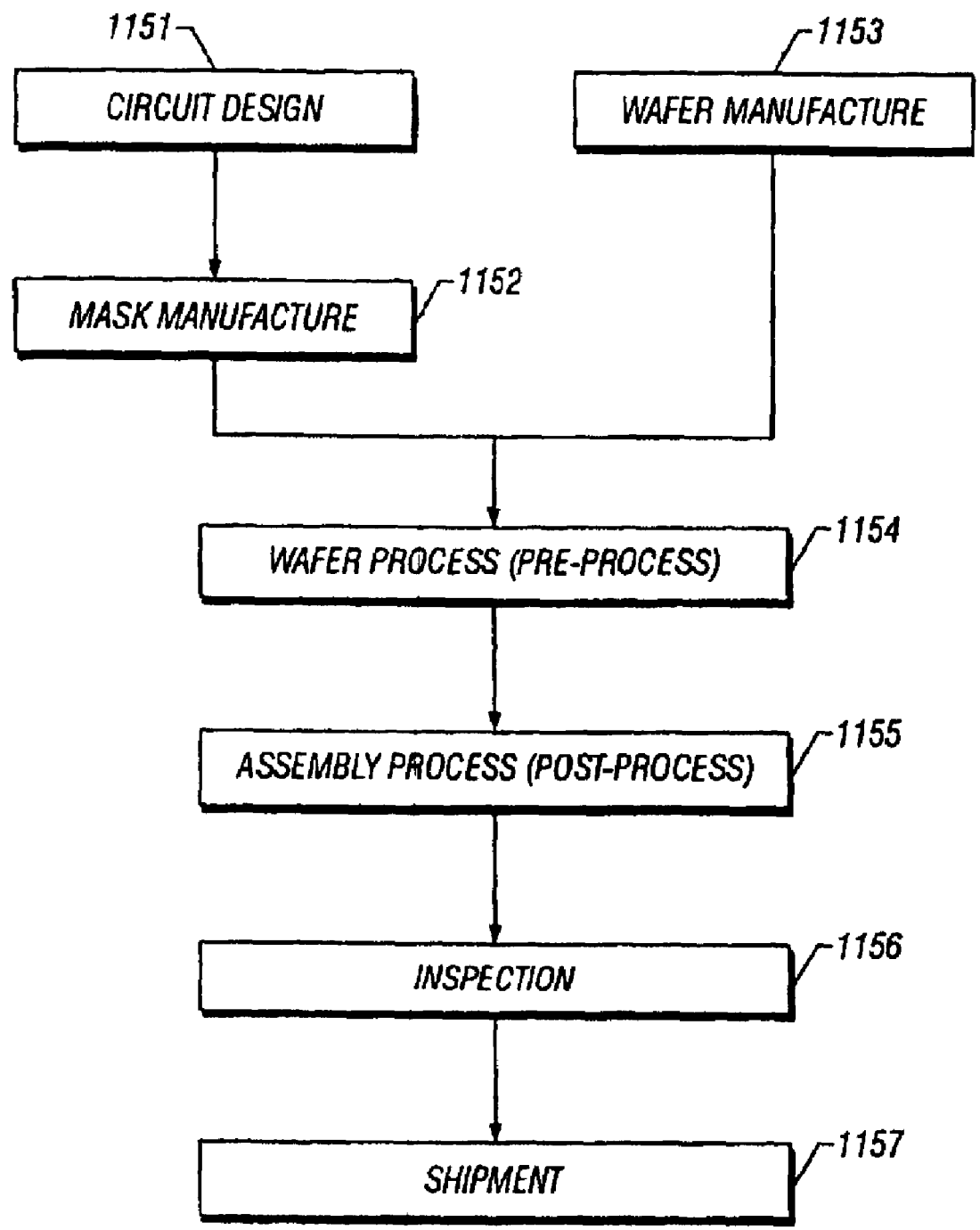
FIG. 7B–FIG. 7C are flow charts that described steps for making integrated circuits.

As is well known in the art, lithography is a critical part of manufacturing methods for making semiconducting devices. For example, U.S. Pat. No. 5,483,343 outlines steps for such manufacturing methods. These steps are described below with reference to FIGS. 7b and 7c. FIG. 7b is a flow chart of the sequence of manufacturing a semiconductor device such as a semiconductor chip (e.g., IC or LSI), a liquid crystal panel or a CCD. Step 1151 is a design process for designing the circuit of a semiconductor device. Step 1152 is a process for manufacturing a mask based on the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

Figure 7C:
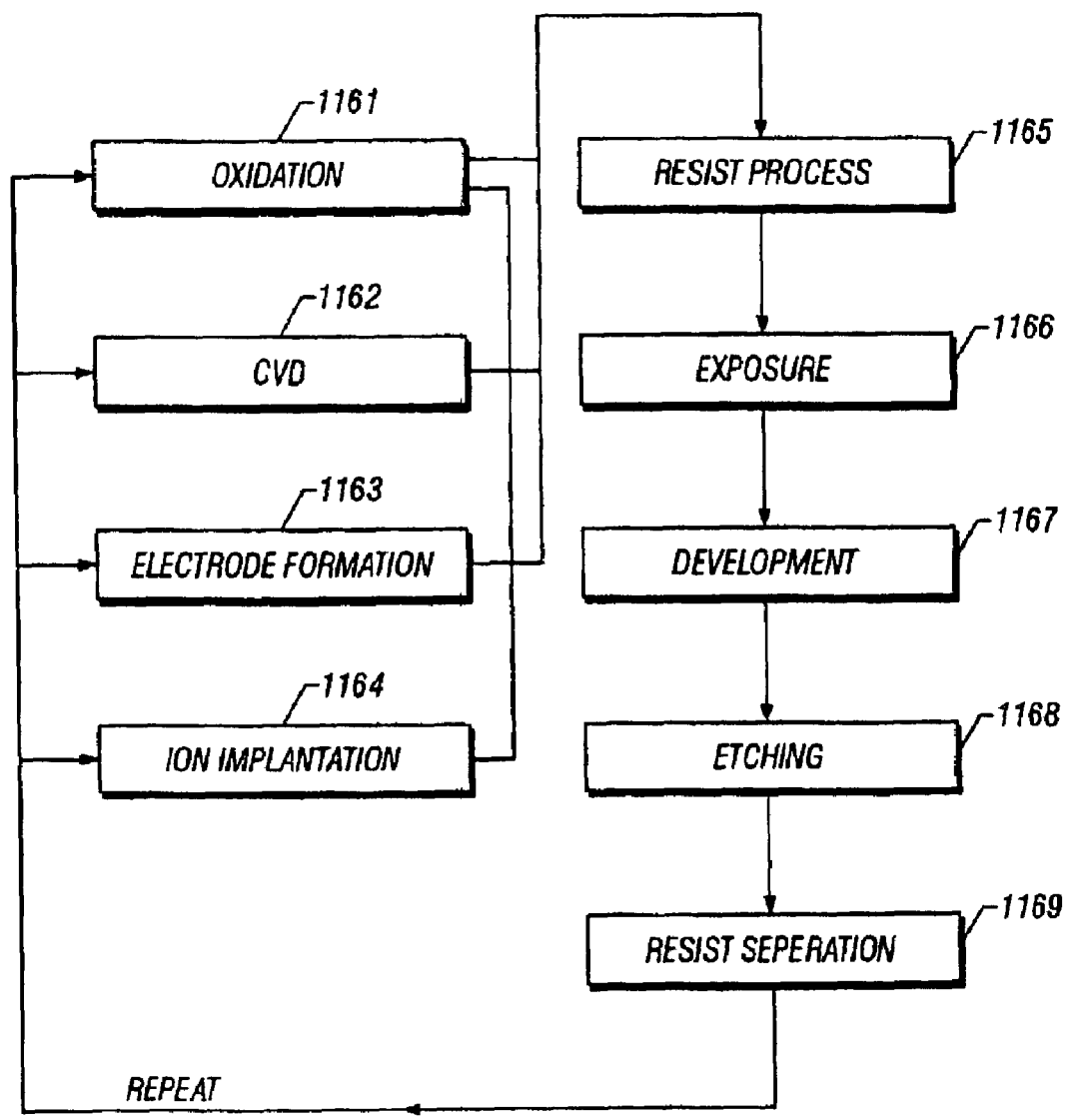

FIG. 7c is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 8:
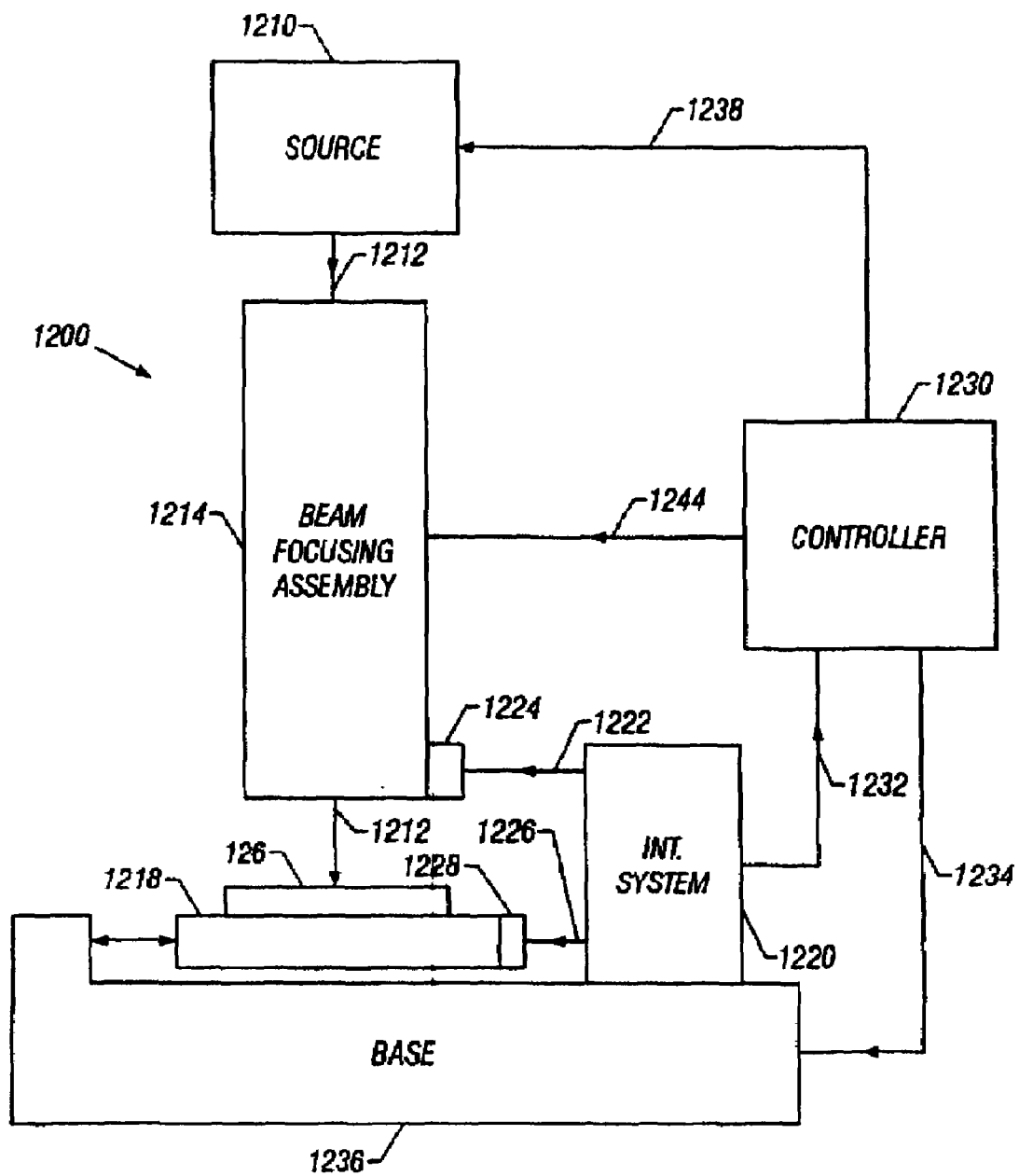
FIG. 8 is a schematic of a beam writing system that includes an interferometry system described herein.

As an example, a schematic of a beam writing system 1200 is shown in FIG. 8. A source 1210 generates a write beam 1212, and a beam focusing assembly 1214 directs the radiation beam to a substrate 1216 supported by a movable stage 1218. To determine the relative position of the stage, an interferometry system 1220 directs a reference beam 1222 to a mirror 1224 mounted on beam focusing assembly 1214 and a measurement beam 1226 to a mirror 1228 mounted on stage 1218. Since the reference beam contacts a mirror mounted on the beam focusing assembly, the beam writing system is an example of a system that uses a column reference. Interferometry system 1220 can be any of the interferometry systems described previously. Changes in the position measured by the interferometry system correspond to changes in the relative position of write beam 1212 on substrate 1216. Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate.

Furthermore, in some embodiments, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

Embodiments of the present invention configured with single pass interferometers and one or two angle interferometers, such as those described herein, may be used to make in-situ characterizations of object mirrors located on a wafer stage. The description of these embodiments are the same as corresponding portions of the description given for use of dynamic interferometers in in-situ characterization of on stage object mirrors in commonly owned U.S. patent application Ser. No. 09/853,114 filed May 10, 2001 entitled "IN-SITU MIRROR CHARACTERIZATION", by Henry Allen Hill, the contents of which are incorporated herein by reference.

In other embodiments, the passive zero shear interferometer may be located on a wafer stage and the object mirrors located off the wafer stage.

A number of embodiments of the invention have been described. Nevertheless, it will be understood that various modifications may be made without departing from the spirit and scope of the invention. Accordingly, other embodiments are within the scope of the following claims.

What is claimed is:

1. An interferometry system, comprising:
    an interferometer which during operation receives an input beam, separates the input beam into a measurement beam and another beam, directs the measurement beam to contact a measurement object, and overlaps the measurement beam after it reflects from the measurement object with the other beam to form an output beam, wherein the measurement object and interferometer are configured to move relative to each other;
    a beam steering assembly having a beam steering element positioned to direct the input beam into the interferometer and to not contact the output beam, and an electronic positioning system to selectively orient the beam steering element relative to the interferometer; and
    a control circuit coupled to the positioning system which during operation causes the positioning system to reorient the beam steering element in response to a change in the angular orientation of the measurement object relative to the interferometer.

2. The system of claim 1, wherein during operation the control circuit causes the positioning system to reorient the beam steering element based on information derived from the output beam.

3. The system of claim 2, wherein the control circuit comprises a signal processor which during operation calculates the change in angular orientation of the measurement object.

4. The system of claim 1, wherein the control circuit causes the positioning system to reorient the beam steering element based on a change in direction or position of the measurement beam.

5. The system of claim 1, wherein the interferometer directs the measurement beam to contact the measurement object multiple times.

6. The interferometry system of claim 1, wherein the measurement object comprises a plane mirror.

7. The interferometry system of claim 6, wherein during operation the beam steering assembly causes the measurement beam to be orthogonal to the plane mirror for a range of orientations of the plane mirror.

8. The system of claim 1, wherein the beam steering assembly changes a propagation direction of the input beam in response to changes in the output beam in order to minimize a difference in propagation directions between the measurement beam and the other beam in the output beam.

9. An interferometry system, comprising:
    an interferometer which during operation receives an input beam, separates the input beam into a measurement beam and another beam, directs the measurement beam to contact a measurement object, and overlaps the measurement beam after it reflects from the measurement object with the other beam to form an output beam;
    a beam steering assembly having a beam steering element positioned to direct the input beam into the interferometer and to not contact the output beam, and an electronic positioning system to selectively orient the beam steering element relative to the interferometer; and
    a control circuit coupled to the positioning system which during operation causes the positioning system to reorient the beam steering element based on information derived from the output beam, wherein the control circuit further comprises a differential angle displacement interferometer, which during operation generates an interference signal related to a difference in propagation directions between the measurement beam and the other beam in the output beam.

10. The system of claim 9, wherein the interference signal is related to a difference in propagation directions in a first plane between the measurement beam and the other beam in the output beam.

11. The system of claim 10, further comprising a second differential angle displacement interferometer, which during operation generates an interference signal related to a difference in propagation directions between the measurement beam and the at least one other beam in the output beam in a second plane perpendicular to the first plane.

12. The system of claim 9, further comprising a beam splitter, which during operation derives a secondary output beam from the output beam and directs the secondary output beam towards the differential angle displacement interferometer.

13. The interferometry system of claim 12, wherein during operation the differential angle displacement interferometer splits the secondary output beam into first and second components, directs the first and second components along first and second paths, and overlaps the first and second components at a detector.

14. The interferometry system of claim 13, wherein during operation the overlapping first and second components cause the detector to generate an interference signal related to a propagation direction of the output beam.

15. The interferometry system of claim 9, wherein the interference signal is related to the orientation of the measurement object.

16. The interferometry system of claim 9, wherein the differential angle displacement interferometer comprises an etalon, and transmission of the secondary output beam through the etalon is related to a propagation direction of the output beam.

17. The system of claim 1, wherein the control circuit further comprises an angle displacement interferometer, which during operation generates an interference signal related to a propagation direction of the output beam.

18. The interferometry system of claim 1, wherein the interferometer is a single pass interferometer.

19. The interferometry system of claim 1, further comprising a light source positioned relative to the beam steering assembly so that during operation the light source directs the input beam toward the beam steering assembly.

20. The interferometry system of claim 1, further comprising a detector positioned to receive the output beam from the interferometer.

21. A lithography system for use in fabricating integrated circuits on a wafer, the system comprising:
a stage for supporting the wafer;
an illumination system for imaging spatially patterned radiation onto the wafer;
a stage positioning system for adjusting the position of the stage relative to the imaged radiation; and
the interferometry system of claim 1, wherein either the interferometer or measurement object are mounted on the stage and the interferometry system is configured to monitor the position of the wafer relative to the imaged radiation.

22. A lithography system for use in fabricating integrated circuits on a wafer, the system comprising:
a stage for supporting the wafer; and
an illumination system including a radiation source, a mask, a mask positioning system, a lens assembly, and the interferometry system of claim 1, wherein either the interferometer or measurement object are mounted on the stage, and wherein during operation the source directs radiation through the mask to produce spatially patterned radiation, the mask positioning system adjusts the position of the mask relative to the radiation from the source, the lens assembly images the spatially patterned radiation onto the wafer, and the interferometry system monitors the position of the mask relative to the radiation from the source.

23. A lithography system for fabricating integrated circuits, comprising:
first and second components, the first and second components being movable relative to one another; and the interferometry system of claim 1 secured to the second component, wherein the measurement object is rigidly secured to the first component and during operation the interferometry system measures the position of the first component relative to the second component.

24. A beam writing system for use in fabricating a lithography mask, the system comprising:
a source providing a write beam to pattern a substrate;
a stage supporting the substrate;
a beam directing assembly for delivering the write beam to the substrate;
a positioning system for positioning the stage and beam directing assembly relative one another; and
the interferometry system of claim 1, wherein either the interferometer or measurement object are mounted on the stage and the interferometry system is configured to monitor the position of the stage relative to the beam directing assembly.

25. A method, comprising:
directing an input beam to contact a beam steering element prior to entering an interferometer;
splitting the directed input beam into a measurement beam and at least one other beam;
directing the measurement beam to reflect from a measurement object at least once, wherein the measurement object and the interferometer are configured to move relative to each other;
overlapping the reflected measurement beam and the at least one other beam to form an output beam which does not contact the beam steering element; and
electronically reorienting the beam steering element in response to a change in the angular orientation of the measurement object relative to the interferometer.

26. A lithography method, comprising:
positioning a first component of a lithography system relative to a second component of a lithography system to expose a wafer to spatially patterned radiation; and
measuring the position of the first component relative to the second component using the method of claim 25 wherein the first component includes the measurement object.

27. A beam writing method for use in fabricating a lithography mask, the method comprising:
directing a write beam to a substrate to pattern the substrate;
positioning the substrate relative to the write beam; and
measuring the position of the substrate relative to the write beam using the interferometry method of claim 25 wherein the position of either the interferometer or the measurement object vary with the position of either the write beam or the substrate.

28. An interferometry system, comprising:
an interferometer which during operation receives an input beam, separates the input beam into a measurement beam and another beam, directs the measurement beam to contact a measurement object multiple times, and overlaps the measurement beam after it reflects from the measurement object with the other beam to form an output beam;

a beam steering assembly having a beam steering element positioned to direct the input beam into the interferometer and to not contact the output beam, and an electronic positioning system to selectively orient the beam steering element relative to the interferometer; and a control circuit coupled to the positioning system which during operation causes the positioning system to reorient the beam steering element based on information derived from the output beam.

29. An interferometry system, comprising:

an interferometer which during operation receives an input beam, separates the input beam into a measurement beam and another beam, directs the measurement beam to contact a measurement object comprising a plane mirror, and overlaps the measurement beam after it reflects from the measurement object with the other beam to form an output beam;

a beam steering assembly having a beam steering element positioned to direct the input beam into the interferometer and to not contact the output beam, and an electronic positioning system to selectively orient the beam steering element relative to the interferometer; and a control circuit coupled to the positioning system which during operation causes the positioning system to reorient the beam steering element to cause the measurement beam to be orthogonal to the plane mirror for a range of orientations of the plane mirror based on information derived from the output beam.

30. An interferometry system, comprising:

an interferometer which during operation receives an input beam, separates the input beam into a measurement beam and another beam, directs the measurement beam to contact a measurement object, and overlaps the measurement beam after it reflects from the measurement object with the other beam to form an output beam;

a beam steering assembly having a beam steering element positioned to direct the input beam into the interferometer and to not contact the output beam, and an electronic positioning system to selectively orient the beam steering element relative to the interferometer; and a control circuit comprising an angle displacement interferometer configured to generate an interference signal related to a propagation direction of the output beam, the control circuit being coupled to the positioning system and configured to cause the positioning system to reorient the beam steering element based on information derived from the output beam.

31. A lithography system for use in fabricating integrated circuits on a wafer, the system comprising:

a stage for supporting the wafer;

an illumination system for imaging spatially patterned radiation onto the wafer;

a stage positioning system for adjusting the position of the stage relative to the imaged radiation; and an interferometry system comprising an interferometer which during operation receives an input beam, separates the input beam into a measurement beam and another beam, directs the measurement beam to contact a measurement object, and overlaps the measurement beam after it reflects from the measurement object with the other beam to form an output beam, wherein either the interferometer or the measurement object are mounted on the stage;

the interferometry system further comprising a beam steering assembly and a control circuit, the beam steering assembly having a beam steering element positioned to direct the input beam into the interferometer and to not contact the output beam, and an electronic positioning system to selectively orient the beam steering element relative to the interferometer, and the control circuit being coupled to the electronic positioning system which during operation causes the electronic positioning system to reorient the beam steering element based on information derived from the output beam, wherein the interferometry system is configured to monitor the position of the wafer relative to the imaged radiation.

32. A lithography system for use in fabricating integrated circuits on a wafer, the system comprising:

a stage for supporting the wafer; and an illumination system including a radiation source, a mask, a mask positioning system, a lens assembly, and an interferometry system comprising an interferometer which during operation receives an input beam, separates the input beam into a measurement beam and another beam, directs the measurement beam to contact a measurement object, and overlaps the measurement beam after it reflects from the measurement object with the other beam to form an output beam, wherein either the interferometer or the measurement object are mounted on the stage;

the interferometry system further comprising a beam steering assembly and a control circuit, the beam steering assembly having a beam steering element positioned to direct the input beam into the interferometer and to not contact the output beam, and an electronic positioning system to selectively orient the beam steering element relative to the interferometer, and the control circuit being coupled to the electronic positioning system which during operation causes the electronic positioning system to reorient the beam steering element based on information derived from the output beam, wherein during operation the source directs radiation through the mask to produce spatially patterned radiation, the mask positioning system adjusts the position of the mask relative to the radiation from the source, the lens assembly images the spatially patterned radiation onto the wafer, and the interferometry system monitors the position of the mask relative to the radiation from the source.

33. A lithography system for fabricating integrated circuits, comprising:

an interferometry system comprising an interferometer which during operation receives an input beam, separates the input beam into a measurement beam and another beam, directs the measurement beam to contact a measurement object, and overlaps the measurement beam after it reflects from the measurement object with the other beam to form an output beam;

the interferometry system further comprising a beam steering assembly and a control circuit, the beam steering assembly having a beam steering element positioned to direct the input beam into the interferometer and to not contact the output beam, and an electronic positioning system to selectively orient the beam steering element relative to the interferometer, and the control circuit being coupled to the positioning system which during operation causes the positioning system to reorient the beam steering element based on information derived from the output beam; and first and second components, the first and second components being movable relative to one another, the interferometer being secured to the second component and the measurement object being rigidly secured to the first component, wherein during operation the interferometry system measures the position of the first component relative to the second component.

34. A beam writing system for use in fabricating a lithography mask, the system comprising:

a source providing a write beam to pattern a substrate;

a stage supporting the substrate;

a beam directing assembly for delivering the write beam to the substrate;

a positioning system for positioning the stage and beam directing assembly relative one another; and an interferometry system comprising an interferometer which during operation receives an input beam, separates the input beam into a measurement beam and another beam, directs the measurement beam to contact a measurement object, and overlaps the measurement beam after it reflects from the measurement object with the other beam to form an output beam, wherein either the interferometer or the measurement object are mounted on the stage;

the interferometry system further comprising a beam steering assembly and a control circuit, the beam steering assembly having a beam steering element positioned to direct the input beam into the interferometer and to not contact the output beam, and an electronic positioning system to selectively orient the beam steering element relative to the interferometer, and the control circuit being coupled to the electronic positioning system which during operation causes the electronic positioning system to reorient the beam steering element based on information derived from the output beam, wherein the interferometry system is configured to monitor the position of the stage relative to the beam directing assembly.

35. A lithography method, comprising:

positioning a first component of a lithography system relative to a second component of a lithography system to expose a wafer to spatially patterned radiation, wherein the first component includes a measurement object; and measuring the position of the first component relative to the second component using an interferometry method that comprises:

directing an input beam to contact a beam steering element prior to entering an interferometer;

splitting the directed input beam into a measurement beam and at least one other beam;

directing the measurement beam to reflect from the measurement object at least once;

overlapping the reflected measurement beam and the at least one other beam to form an output beam which does not contact the beam steering element; and electronically reorienting the beam steering element based on information derived from the output beam.

36. A beam writing method for use in fabricating a lithography mask, the method comprising:

directing a write beam to a substrate to pattern the substrate;

positioning the substrate relative to the write beam; and measuring the position of the substrate relative to the write beam using an interferometry method that comprises:

directing an input beam to contact a beam steering element prior to entering an interferometer;

splitting the directed input beam into a measurement beam and at least one other beam;

directing the measurement beam to reflect from a measurement object at least once;

overlapping the reflected measurement beam and the at least one other beam to form an output beam which does not contact the beam steering element; and electronically reorienting the beam steering element based on information derived from the output beam, wherein the position of either the interferometer or the measurement object vary with the position of either the write beam or the substrate.

* * * * *